US008558609B2

(12) United States Patent
Fang et al.

(10) Patent No.: US 8,558,609 B2
(45) Date of Patent: Oct. 15, 2013

(54) AMPLIFICATION SYSTEMS AND METHODS WITH NOISE REDUCTIONS

(75) Inventors: Lieyi Fang, Shanghai (CN); Yunchao Zhang, Shanghai (CN); Tingzhi Yuan, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 128 days.

(21) Appl. No.: 13/273,067

(22) Filed: Oct. 13, 2011

(65) Prior Publication Data
US 2013/0057238 A1 Mar. 7, 2013

(30) Foreign Application Priority Data

Sep. 6, 2011 (CN) .......................... 2011 1 0268688

(51) Int. Cl.
H03F 3/38 (2006.01)
(52) U.S. Cl.
USPC ........... 330/10; 330/251; 330/207 A; 327/316
(58) Field of Classification Search
USPC ................. 330/10, 251, 207 A; 327/316, 307
See application file for complete search history.

(56) References Cited

U.S. PATENT DOCUMENTS

| 5,363,055 | A | 11/1994 | Ribner |
| 6,016,075 | A * | 1/2000 | Hamo ............................ 330/10 |
| 6,169,440 | B1 | 1/2001 | Liu |
| 6,201,417 | B1 * | 3/2001 | Blum et al. ...................... 327/14 |
| 6,229,389 | B1 * | 5/2001 | Pullen et al. .................... 330/10 |
| 6,998,850 | B2 | 2/2006 | Baumgartner |
| 7,061,213 | B2 * | 6/2006 | Yoshida ......................... 323/224 |
| 7,076,070 | B2 * | 7/2006 | Pearce et al. ................... 381/120 |
| 7,279,970 | B2 | 10/2007 | Yokoyama et al. |
| 7,345,533 | B2 | 3/2008 | Lee |
| 7,400,191 | B2 * | 7/2008 | Rodriguez ...................... 330/10 |
| 7,492,219 | B1 | 2/2009 | Cyrusian |
| 8,022,756 | B2 * | 9/2011 | Walker et al. ................... 330/10 |
| 2006/0008095 | A1 | 1/2006 | Tsuji |
| 2007/0040608 | A1 | 2/2007 | Magrath et al. |
| 2009/0135694 | A1 | 5/2009 | Wang |
| 2009/0160551 | A1 | 6/2009 | Chen et al. |
| 2010/0045356 | A1 | 2/2010 | Berkhout et al. |

OTHER PUBLICATIONS

United States Patent and Trademark Office, Office Action mailed Jan. 2, 2013, in related U.S. Appl. No. 13/273,061.
United States Patent and Trademark Office, Office Action mailed Aug. 6, 2013, in related U.S. Appl. No. 13/273,061.

* cited by examiner

Primary Examiner — Patricia Nguyen
(74) Attorney, Agent, or Firm — Jones Day

(57) ABSTRACT

System and method for amplifying an input signal to generate an output signal. The system includes a current generator, an oscillator, and a comparator. The current generator is configured to receive a first voltage signal, and generate a first current signal based on at least information associated with the first voltage signal and the first reference signal. The oscillator is configured to receive at least the first current signal and a second reference signal, and to generate a second voltage signal based on at least information associated with the first current signal and the second reference signal, the second voltage signal being associated with a modulation frequency. Additionally, the comparator is configured to receive the second voltage signal and a third voltage signal, and to generate a modulation signal related to the modulation frequency based on at least information associated with the second voltage signal and the third voltage signal.

35 Claims, 13 Drawing Sheets

US 8,558,609 B2

AMPLIFICATION SYSTEMS AND METHODS WITH NOISE REDUCTIONS

1. CROSS-REFERENCES TO RELATED APPLICATIONS

This application claims priority to Chinese Patent Application No. 201110268688.8, filed Sep. 6, 2011, commonly assigned, incorporated by reference herein for all purposes.

2. BACKGROUND OF THE INVENTION

The present invention is directed to integrated circuits. More particularly, the invention provides amplification systems and methods with noise reductions. Merely by way of example, the invention has been applied to a Class-D amplifier. But it would be recognized that the invention has a much broader range of applicability.

Usually, a switching amplifier (e.g., a Class-D amplifier) is an amplifier where output transistors are often operated as switches. The Class-D amplifier is widely used in audio amplification, and has power-efficiency advantages over certain linear audio-amplifier classes such as Class A, B, and AB.

FIG. 1 is a simplified conventional diagram showing an amplification system using a Class-D amplifier. The amplification system 100 includes a modulator 102, two transistors 104 and 106, an inductor 108, a resistor 110, two capacitors 112 and 114, and an output load 116. For example, the transistor 104 is a P-channel metal-oxide-semiconductor field effect transistor (MOSFET), or an N-channel MOSFET. In another example, the transistor 106 is an N-channel MOSFET. In yet another example, the output load 116 is a speaker. In yet another example, the inductor 108 and the capacitor 112 are included in a low pass filter. In yet another example, the modulator 102, and the transistors 104 and 106 are included in a Class-D amplifier 130.

The modulator 102 receives an input audio signal 118, and generates gate drive signals 120 and 122. For example, the gate drive signals 120 and 122 are the same or different. In yet another example, pulse widths of the gate drive signals 120 and 122 are related to the amplitude of the input audio signal 118. In yet another example, if the amplitude of the input audio signal 118 is constantly zero, the modulator 102 outputs the gate drive signals 120 and 122 at a 50% duty cycle. In yet another example, if the amplitude of the input audio signal 118 has a proper positive value, the modulator 102 outputs the gate drive signal 120 at a close to 100% duty cycle, and the modulator 102 outputs the gate drive signal 122 at a close to 0% duty cycle. In yet another example, if the amplitude of the input audio signal 118 has a proper negative value, the modulator 102 outputs the gate drive signal 120 at a close to 0% duty cycle, and the modulator 102 outputs the gate drive signal 122 at a close to 100% duty cycle.

The gate drive signals 120 and 122 are then received by the transistors 104 and 106, respectively. The transistors 104 and 106 in response generate an output voltage signal 124 (e.g., $V_{out}$), and an output current 128 (e.g., $I_L$). For example, the gate drive signals 120 and 122 are logic control signals, and hence the transistors 104 and 106 operate like switches. In another example, the transistor 104 is turned on by the gate drive signal 120, and the transistor 106 is turned off by the gate drive signal 122. Then, the output voltage signal 124 is equal to a positive power supply voltage (e.g., PVCC). The output current 128 increases, and energy is delivered to the output load 116.

In yet another example, the transistor 104 is turned off by the gate drive signal 120, and the transistor 106 is turned on by the gate drive signal 122. Then, the output voltage signal 124 is equal to a negative power supply voltage (e.g., ground). The output current 128 decreases in magnitude, or the flow direction of the output current 128 is reversed. In yet another example, the output voltage signal 124 (e.g., $V_{out}$) is a pulse signal that has a same duty cycle as the gate drive signal 120 or 122.

The low pass filter including the inductor 108 and the capacitor 112, along with the resistor 110 and the capacitor 114, receives the output voltage signal 124 and the output current 128. In response, an output audio signal 126 is generated to drive the output load 116. For example, the output audio signal 126 is approximately equal to the input audio signal 118.

But in some situations, the Class-D amplifier 130 generates undesired audible transients (e.g., clicks and/or pops), which are often related to the start or stop of PWM switching, offsets of output direct current (DC), and transients of power supply. For example, the Class-D amplifier 130 generates the undesired audible transients if the amplification system 100 changes its operation mode. In another example, the Class-D amplifier 130 generates the undesired audible transients during the process of powering up the amplification system 100 or the process of powering down the amplification system 100. In yet another example, the Class-D amplifier 130 generates the undesired audible transients if the amplification system 100 enters a mute mode (e.g., the gain of the Class-D amplifier 130 is zero) or an un-mute mode (e.g., the gain of the Class-D amplifier 130 is not zero).

FIG. 2 is a simplified conventional diagram showing certain components of the Class-D amplifier 130 as part of the amplification system 100. The amplification system 100 includes the two transistors 104 and 106, the inductor 108, the resistor 110, the two capacitors 112 and 114, and the output load 116. Further, the amplification system 100 includes a loop filter 202, a pulse width modulation (PWM) signal generator 204, and a logic and gate driver 206. For example, the loop filter 202, the PWM signal generator 204, and the logic and gate driver 206 are included in the modulator 102. In another example, the loop filter 202, the PWM signal generator 204, the logic and gate driver 206, and the transistors 104 and 106 are included in the Class-D amplifier 130.

The loop filter 202 receives an input audio signal 208, and generates in response an output signal 210. The PWM signal generator 204 receives the output signal 210 as well as a ramping signal 212, and generates in response a PWM signal 214. The logic and gate driver 206 receives the PWM signal 214, and generates two gate drive signals 216 and 218. For example, the ramping signal 212 has a triangle waveform. In another example, the gate drive signals 216 and 218 are the same or different. In yet another example, pulse widths of the PWM signal 214 are proportional to the amplitude of the input audio signal 208. In yet another example, pulse widths of the gate drive signals 216 and 218 are proportional to the amplitude of the input audio signal 208.

The gate drive signals 216 and 218 are then received by the transistors 104 and 106, respectively. In response, the transistors 104 and 106 generate an output signal 220. For example, if the PWM signal 214 is at a logic high level, the transistor 104 is turned on by the gate drive signal 216, and the transistor 106 is turned off by the gate drive signal 218. Then, the output signal 220 is equal to a positive power supply voltage (e.g., PVCC). In another example, if the PWM signal 214 is at a logic low level, the transistor 104 is turned off by the gate drive signal 216, and the transistor 106 is turned on by the gate drive signal 218. Then, the output signal 220 is equal to a negative power supply voltage (e.g., ground).

The low pass filter including the inductor 108 and the capacitor 112, along with the resistor 110 and the capacitor 114, receives the output signal 220. In response, an output audio signal 222 is generated to drive the output load 116. For example, the output audio signal 222 is approximately equal to the input audio signal 208. In another example, a DC voltage or an averaged voltage across the capacitor 114 is often required to be approximately equal to half of the positive power supply voltage, e.g., PVCC/2, in order for the amplifier 130 to operate properly. The voltage across the capacitor 114 is often referred to as an output common-mode voltage level.

The output signal 220 is received by the loop filter 202 as a negative feedback signal to correct non-linearity and errors in order to improve performance of the amplification system 100 (e.g., reduce distortions). Also, the output signal 220 is filtered by the low pass filter including the inductor 108 and the capacitor 112. For example, the output signal 220 often contains harmonics in a wide frequency range, considering that the switching frequency of the amplifier 130 usually ranges from several hundred kHz or even above 1 MHz. In another example, the low pass filter including the inductor 108 and the capacitor 112 is often needed to recover the input audio signal 208 for an audio range of 20-22 kHz.

Some noise-reduction techniques are often used to reduce the undesired audible transients generated during the process of powering up or powering down the amplification system 100. For example, an input common-mode DC ramping signal is applied so that the output common-mode DC signal follows the input common-mode DC ramping signal and slowly charges the capacitor 114, in order to achieve the ramping up of the output common-mode DC signal. Such ramping up of the output common-mode DC signal, along with the gain ramping-up, is used to reduce the undesired audible transients during the process of powering up the amplification system 100. In another example, ramping down of an output common-mode DC signal, along with a gain ramping-down, is used to reduce the undesired audible transients during the process of powering down the amplification system 100. In yet another example, a gain ramping-up is used to reduce the undesired audible transients if the amplification system 100 switches from the mute mode to the un-mute mode. In yet another example, a gain ramping-down is used to reduce the undesired audible transients if the amplification system 100 switches from the un-mute mode to the mute mode.

But, even though the above-mentioned noise-reduction techniques are applied, the undesired audible transients may still be generated in some situations. For example, if the Class-D amplifier 130 has a switching frequency of several hundred kHz, cycle skipping is usually observed at a low common-mode DC ramping level. The cycle skipping often causes the switching frequency of the amplifier 130 to fall into a range of audible frequencies, and hence the undesired audible transients (e.g., clicks and/or pops) can be generated.

Hence it is highly desirable to improve the techniques of noise reduction in amplification systems.

3. BRIEF SUMMARY OF THE INVENTION

The present invention is directed to integrated circuits. More particularly, the invention provides amplification systems and methods with noise reductions. Merely by way of example, the invention has been applied to a Class-D amplifier. But it would be recognized that the invention has a much broader range of applicability.

According to one embodiment, a system for amplifying an input signal to generate an output signal includes a current generator, an oscillator, and a comparator. The current generator is configured to receive a first voltage signal, process information associated with the first voltage signal and a first reference signal, and generate a first current signal based on at least information associated with the first voltage signal and the first reference signal. The oscillator is configured to receive at least the first current signal and a second reference signal, and to generate a second voltage signal based on at least information associated with the first current signal and the second reference signal, the second voltage signal being associated with a modulation frequency. The comparator is configured to receive the second voltage signal and a third voltage signal, and to generate a modulation signal related to the modulation frequency based on at least information associated with the second voltage signal and the third voltage signal, the third voltage signal being related to at least the input signal, the first voltage signal, and a feedback signal, the feedback signal being associated with the output signal. Additionally, the first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude.

According to another embodiment, a system for amplifying an input signal to generate an output signal includes a signal detection component, a signal selection component, a current generator, an oscillator, and a first comparator. The signal detection component is configured to receive the output signal and to generate a first reference signal. The signal selection component is configured to receive the first reference signal and a first voltage signal, and to generate a selected signal based on information associated with the first reference signal and the first voltage signal. The current generator is configured to receive the first reference signal and the first voltage signal, process information associated with the first reference signal, the first voltage signal and a second reference signal, and generate a first current signal based on at least information associated with the first reference signal, the first voltage signal and the second reference signal. The oscillator is configured to receive at least the first current signal and a third reference signal, and to generate a second voltage signal based on at least information associated with the first current signal and the third reference signal, the second voltage signal being associated with a modulation frequency. The first comparator configured to receive the second voltage signal and a third voltage signal, and to generate a modulation signal related to the modulation frequency based on at least information associated with the second voltage signal and the third voltage signal, the third voltage signal being related to at least the input signal, the selected signal, and a feedback signal, the feedback signal being associated with the output signal. Further, the first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude.

According to yet another embodiment, a method for amplifying an input signal to generate an output signal includes receiving a first voltage signal, processing information associated with the first voltage signal and a first reference signal, and generating a first current signal based on at least information associated with the first voltage signal and the first reference signal. Additionally, the method includes receiving at least the first current signal and a second reference signal, processing information associated with the first current signal and the second reference signal, and generating a second voltage signal based on at least information associated with the first current signal and the second reference signal, the second voltage signal being associated with a modulation frequency. Furthermore, the method includes receiving the second voltage signal and a third voltage signal, processing information associated with the second voltage signal and the third voltage signal, and generating a modulation signal related to the modulation frequency based on at least information associated with the second voltage signal and the third voltage signal, the third voltage signal being related to at least the input signal, the first voltage signal, and a feedback signal, the feedback signal being associated with the output signal. Moreover, the first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude.

According to yet another embodiment, a method for amplifying an input signal to generate an output signal includes receiving the output signal, processing information associated with the output signal, and generating a first reference signal. The method further includes receiving the first reference signal and a first voltage signal, processing information associated with the first reference signal and the first voltage signal, and generating a selected signal based on information associated with the first reference signal and the first voltage signal. Additionally, the method includes receiving the first reference signal and the first voltage signal, processing information associated with the first reference signal, the first voltage signal and a second reference signal, and generating a first current signal based on at least information associated with the first reference signal, the first voltage signal and the second reference signal. Furthermore, the method includes receiving at least the first current signal and a third reference signal, processing information associated with the first current signal and the third reference signal, and generating a second voltage signal based on at least information associated with the first current signal and the third reference signal, the second voltage signal being associated with a modulation frequency. Moreover, the method includes receiving the second voltage signal and a third voltage signal, processing information associated with the second voltage signal and the third voltage signal, and generating a modulation signal related to the modulation frequency based on at least information associated with the second voltage signal and the third voltage signal, the third voltage signal being related to at least the input signal, the selected signal, and a feedback signal, the feedback signal being associated with the output signal. The first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

FIG. 7(*b*) is a simplified timing diagram for the amplification system during the process of powering down or shutting down the amplification system according to an embodiment of the present invention.

FIG. 11(*b*) is a simplified timing diagram for the amplification system during the process of powering down or shutting down the amplification system according to an embodiment of the present invention.

5. DETAILED DESCRIPTION OF THE INVENTION

The present invention is directed to integrated circuits. More particularly, the invention provides amplification systems and methods with noise reductions. Merely by way of example, the invention has been applied to a Class-D amplifier. But it would be recognized that the invention has a much broader range of applicability.

Figure 1:
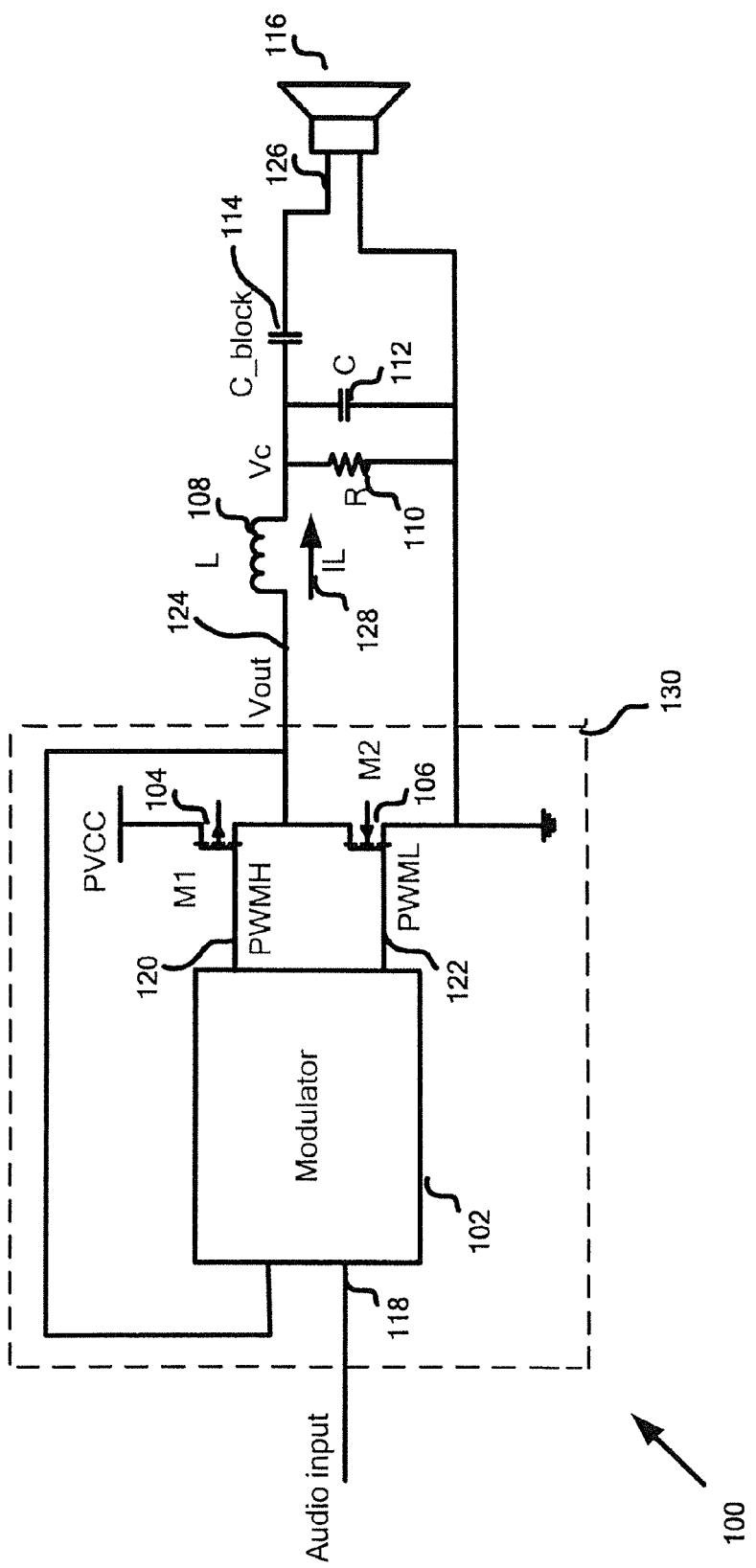
FIG. 1 is a simplified conventional diagram showing an amplification system using a Class-D amplifier.
Figure 2:
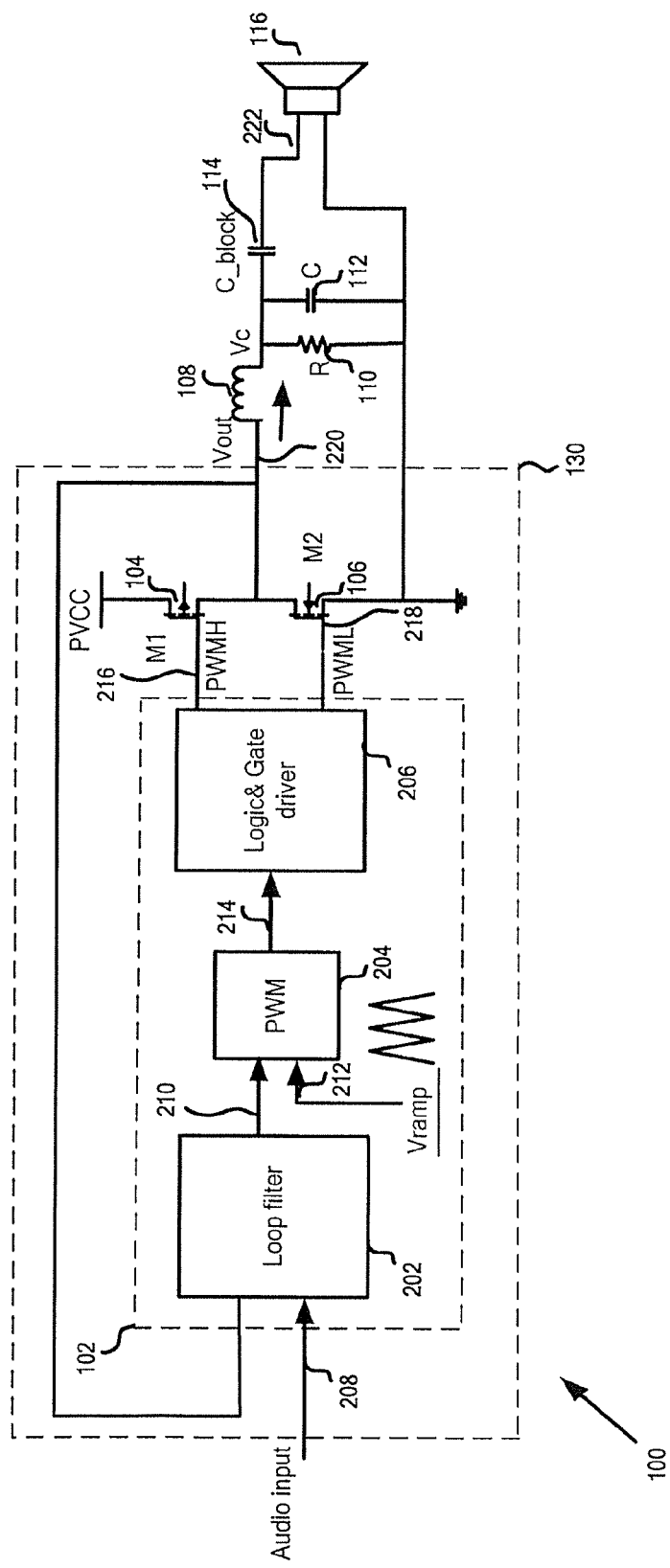
FIG. 2 is a simplified conventional diagram showing certain components of the Class-D amplifier as part of the amplification system.

Referring to FIG. 2, for example, the capacitor 114 is often discharged if the amplification system 100 is powered down. In another example, if the voltage across the capacitor 114 is zero before the amplification system 100 is powered up, the capacitor 114 often needs to be charged to a predetermined voltage (e.g., PVCC/2) before the amplification system 100 performs audio amplification. Usually, charging and/or discharging the capacitor 114 in a short time period results in the undesired audible transients. Hence, controlling the time periods for charging and/or discharging the capacitor 114 is often important in reducing the undesired audible transients generated by the Class-D amplifier 130.

Figure 3:
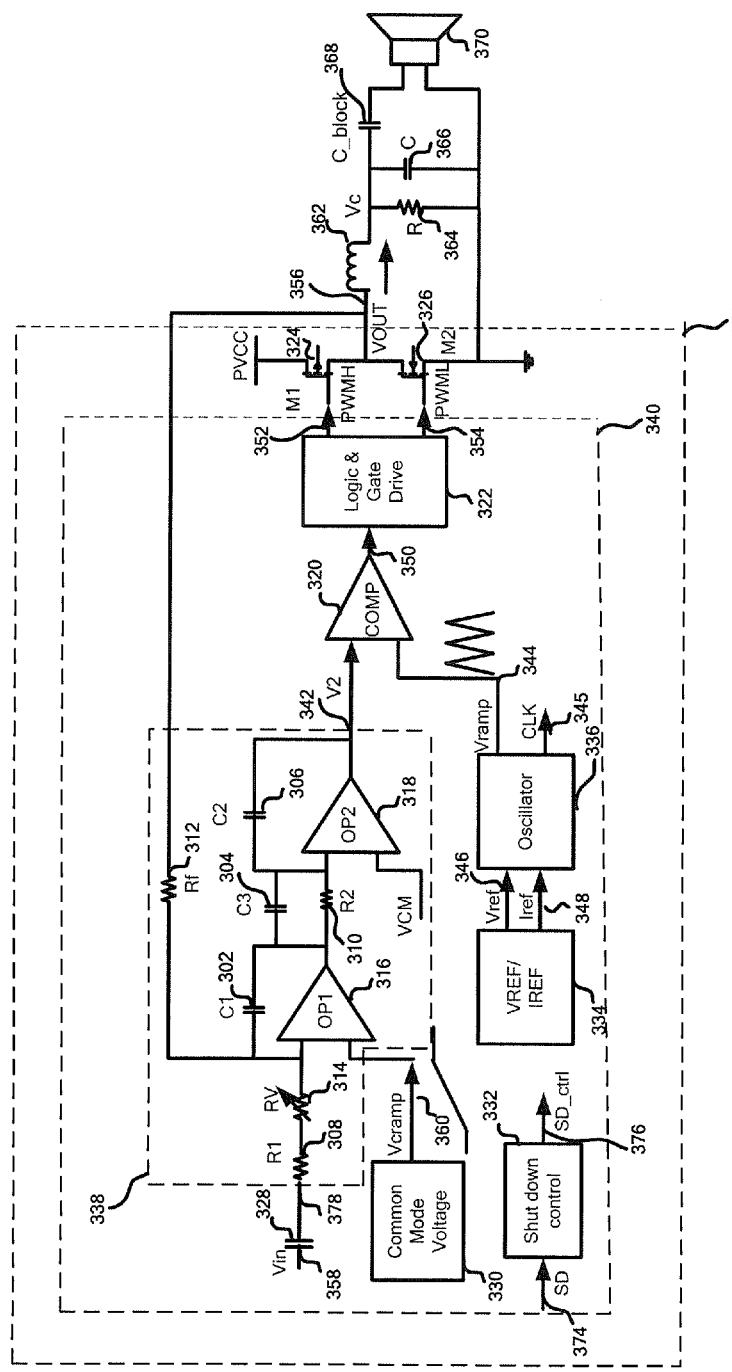
FIG. 3 is a simplified diagram showing an amplification system according to one embodiment.

FIG. 3 is a simplified diagram showing an amplification system according to one embodiment. The amplification system 300 includes six capacitors 302, 304, 306, 328, 366 and 368, four resistors 308, 310, 312 and 364, a variable resistor 314, an inductor 362, two operational amplifiers 316 and 318, a comparator 320, a logic and gate driver 322, two transistors 324 and 326, and an output load 370. Further, the amplification system 300 includes a common-mode voltage component 330, a shut down control component 332, a reference signal component 334, and an oscillator 336.

For example, the capacitors 302, 304 and 306, the resistors 308, 310 and 312, and the operational amplifiers 316 and 318 are included in a second order loop filter 338. In yet another example, the capacitors 302, 304, 306 and 328, the resistors 308, 310 and 312, the variable resistor 314, the operational amplifiers 316 and 318, the comparator 320, the logic and gate driver 322, the common-mode voltage component 330, the reference signal component 334, the oscillator 336, and the shut down control component 332 are included in a modulator 340. In yet another example, the modulator 340 and the transistors 324 and 326 are included in a Class-D amplifier 372.

According to one embodiment, an input audio signal 358 is received at the capacitor 328 that in response outputs an input signal 378. For example, the loop filter 338 receives the input signal 378 and a signal 360 generated by the common-mode voltage component 330, and in response generates an output signal 342. In another example, at the comparator 320, the output signal 342 is compared with a ramping signal 344 (e.g., $V_{ramp}$) generated by the oscillator 336. In yet another example, the ramping signal 344 has a triangle waveform. In yet another example, the oscillator 336 generates the ramping signal 344 and a clock signal 345 based on a reference voltage signal 346 (e.g., Vref) and a reference current signal 348 (e.g., Iref) generated by the reference signal component 334. In yet another example, the clock signal 345 is related to the switching frequency of the amplifier 372.

According to another embodiment, based on the comparison of the ramping signal 344 and the output signal 342, the comparator 320 outputs a modulation signal 350 to the logic and gate driver 322. For example, in response, the logic and gate driver 322 generates two gate drive signals 352 and 354. In another example, the transistors 324 and 326 receive the gate drive signals 352 and 354 respectively, and generate an output signal 356 (e.g., $V_{out}$) to drive the output load 370. In yet another example, the output signal 356 (e.g., $V_{out}$) is fed back through the resistor 312 to an input terminal of the operational amplifier 316. In yet another example, at the other input terminal, the operational amplifier 316 receives the signal 360 (e.g., $V_{cramp}$) generated by the common-mode voltage component 330. The signal 360 is often referred to as an input common-mode voltage level of the amplifier 372. In yet another example, the gate drive signals 352 and 354 are the same or different. In yet another example, the modulation signal 350 includes a PWM signal.

According to yet another embodiment, the variable resistor 314 changes its resistance from infinity to a low value (e.g., zero) based on a control signal (e.g., a gain ramping signal). For example, if the resistance of the resistor 314 is infinity, the gain of the amplifier 372 is zero, which is often referred to as the mute mode of the amplifier 372. In yet another example, the shut down control component 332 receives a shut down signal 374, and generates a shut down control signal 376. In yet another example, the shutdown control signal 376 powers down or starts up the amplification system 300 depending on the logic level of the shut down signal 374.

As noted above, controlling the time periods for charging and/or discharging a blocking capacitor (e.g., the capacitor 368) is often important in reducing the undesired audible transients generated by a Class-D amplifier (e.g., the amplifier 372). According to yet another embodiment, the voltage across the capacitor 368 follows the input common-mode voltage level 360 of the amplifier 372. Hence, the time periods for charging and/or discharging the capacitor 368 are controlled by adjusting the input common-mode voltage level 360 of the amplifier 372 according to certain embodiments.

Figure 4:
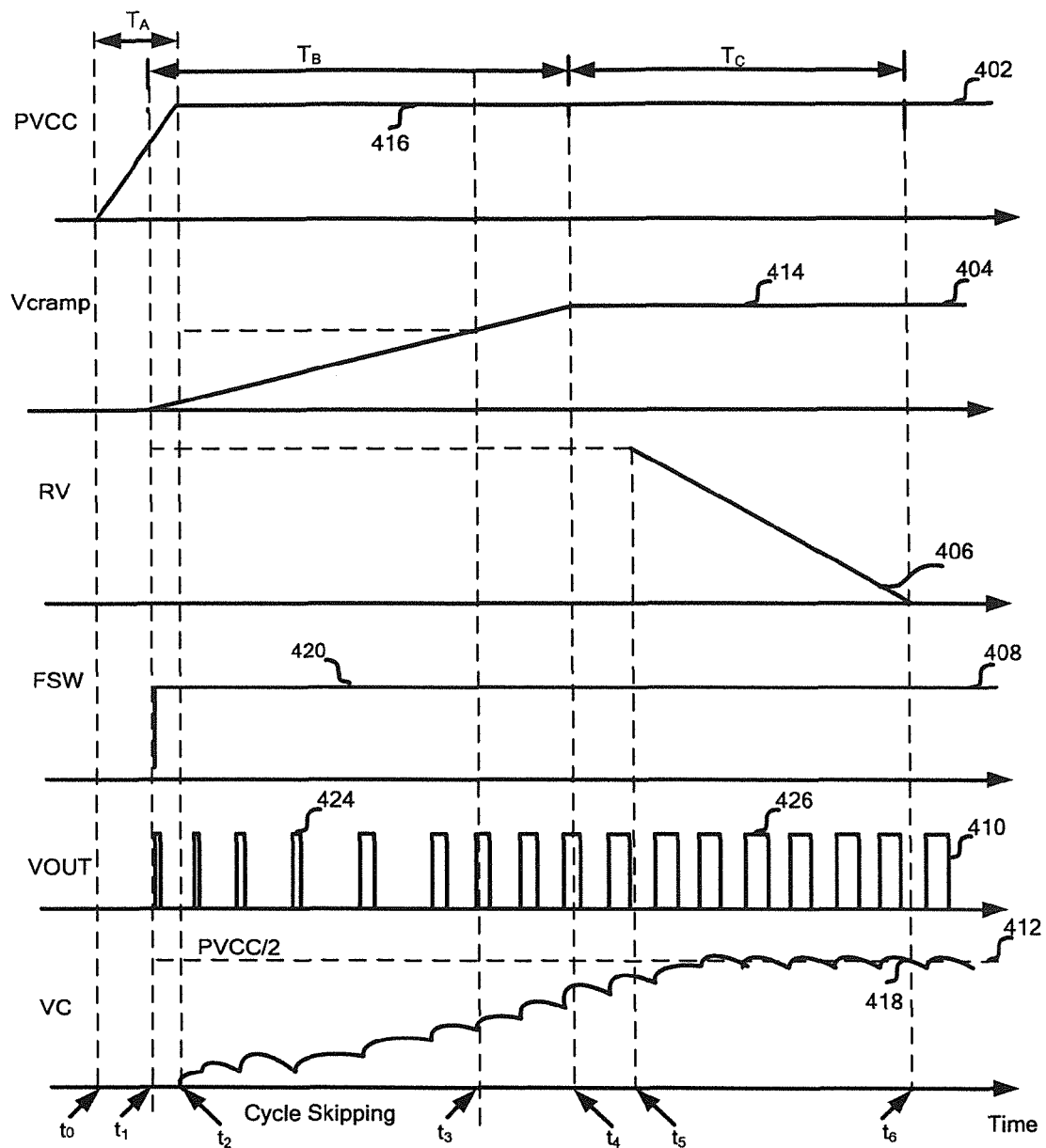
FIG. 4 is a simplified timing diagram for the amplification system during the process of powering up the amplification system.

FIG. 4 is a simplified timing diagram for the amplification system 300 during the process of powering up the amplification system 300. The waveform 402 represents the positive power supply voltage as a function of time, the waveform 404 represents the signal 360 (e.g., $V_{cramp}$) as a function of time, and the waveform 406 represents the resistance of the variable resistor 314 (e.g., RV) as a function of time. Additionally, the waveform 408 represents the switching frequency of the amplifier 372 (e.g., $F_{SW}$) as a function of time, the waveform 410 represents the output signal 356 (e.g., $V_{out}$) as a function of time, and the waveform 412 represents the voltage across the capacitor 368 (e.g., $V_C$) as a function of time.

Three times periods $T_A$, $T_B$, and $T_C$ are shown in FIG. 4. The time period $T_A$ starts at time $t_0$ and ends at time $t_2$, the time period $T_B$ starts at time $t_1$ and ends at time $t_4$, and the time period $T_C$ starts at time $t_4$ and ends at time $t_6$. For example, the time $t_3$ is within the time period $T_B$, and the time $t_5$ is within the time period $T_C$. In another example, $t_0 \leq t_1 \leq t_2 \leq t_3 \leq t_4 \leq t_5 \leq t_6$. In yet another example, the voltage across the capacitor 368 (e.g., $V_C$) has a direct current (DC) component and an alternate current (AC) component.

In one embodiment, the positive power supply voltage ramps up at the beginning of the time period $T_A$ (e.g., at the time $t_0$). For example, during the time period $T_A$, the positive power supply voltage increases from a low value (e.g., approximately zero at the time $t_0$) to a predetermined voltage 416 (e.g., PVCC at the time $t_2$) as shown by the waveform 402. In another example, the positive power supply voltage remains at the predetermined voltage 416 during the rest of the powering up process (e.g., as shown by the waveform 402). Hence, the transistors 324 and 326 can operate properly as switches according to certain embodiments.

According to another embodiment, at the beginning of the time period $T_B$ (e.g., before the time $t_3$), the magnitude of the signal 360 is low. In another example, in response, the modulation signal 350 generated by comparing the output signal 342 with the ramping signal 344 (e.g., $V_{ramp}$) at the comparator 320 has narrow pulse widths and a low pulse density. Hence, at the beginning of the time period $T_B$ (e.g., before the time $t_3$), the pulse widths of the output signal 356 (e.g., $V_{out}$) are narrow (e.g., the pulse width 424), and the pulse density of the output signal 356 is low (e.g., as shown by the waveform 410) according to certain embodiments.

According to yet another embodiment, during the time period $T_B$, the signal 360 (e.g., $V_{cramp}$) ramps up (e.g., from zero at the time $t_1$ to a predetermined value 414 at the time $t_4$, as shown by the waveform 404). For example, the switching frequency of the amplifier 372 remains at a predetermined value 420 (e.g., as shown by the waveform 408). In another example, the pulse widths and the pulse density of the output signal 356 increase gradually during the time period $T_B$. In yet another example, the DC component of the voltage across the capacitor 368 ramps up from a low value (e.g., approximately zero at the time $t_1$) as shown by the waveform 412. In yet another example, the resistance of the variable resistor 314 (e.g., RV) is infinity during the time period $T_B$ (e.g., as shown by the waveform 406). Hence, the gain of the amplifier 372 is zero (e.g., the mute mode of the amplifier 372) according to certain embodiments.

According to yet another embodiment, during the time period $T_C$, the signal 360 remains at the predetermined value 414 (e.g., as shown by the waveform 404). For example, the switching frequency of the amplifier 372 remains at the predetermined value 420 (e.g., as shown by the waveform 408). In another example, the DC component of the voltage across the capacitor 368 (e.g., $V_C$) continues to increase to reach a predetermined value 418 (e.g., PVCC/2, as shown by the waveform 412). In yet another example, the pulse widths and the pulse density of the output signal 356 do not vary much during the time period $T_C$ (e.g., as shown by the waveform 410). In yet another example, at the beginning of the time period $T_C$ (e.g., before the time $t_5$), the resistance of the variable resistor 314 (e.g., RV) is infinity. In yet another example, at the time $t_5$, the resistance of the variable resistor 314 (e.g., RV) decreases from infinity to a low value (e.g., approximately zero) as shown by the waveform 406. Hence, the amplifier 372 operates to amplify the input audio signal 358 (e.g., after the time $t_5$) according to certain embodiments.

For example, the closed-loop bandwidth and characteristics of the amplifier 372 that determine a dynamic response of the entire amplification system 300 are often designed for operations using the signal 360 (e.g., $V_{cramp}$) at a properly value, which is usually required for optimal audio performance and stability. But, before the time $t_3$, the signal 360 has a low value as shown by the waveform 404. Hence, the closed-loop bandwidth and characteristics of the amplifier 372 causes the pulse density of the output signal 356 to be low, which is often called the cycle skipping or burst switching, according to certain embodiments. In another example, the cycle skipping causes the transistors 324 and 326 to switch on or off at a frequency within the audio frequency range, which results in the undesired audible transients. For a constant switching frequency (e.g., the switching frequency 420 as shown by the waveform 408), if the ramping rate of the signal 360 (e.g., $V_{cramp}$) is low, the undesired audible transients can become worse.

Figure 5:
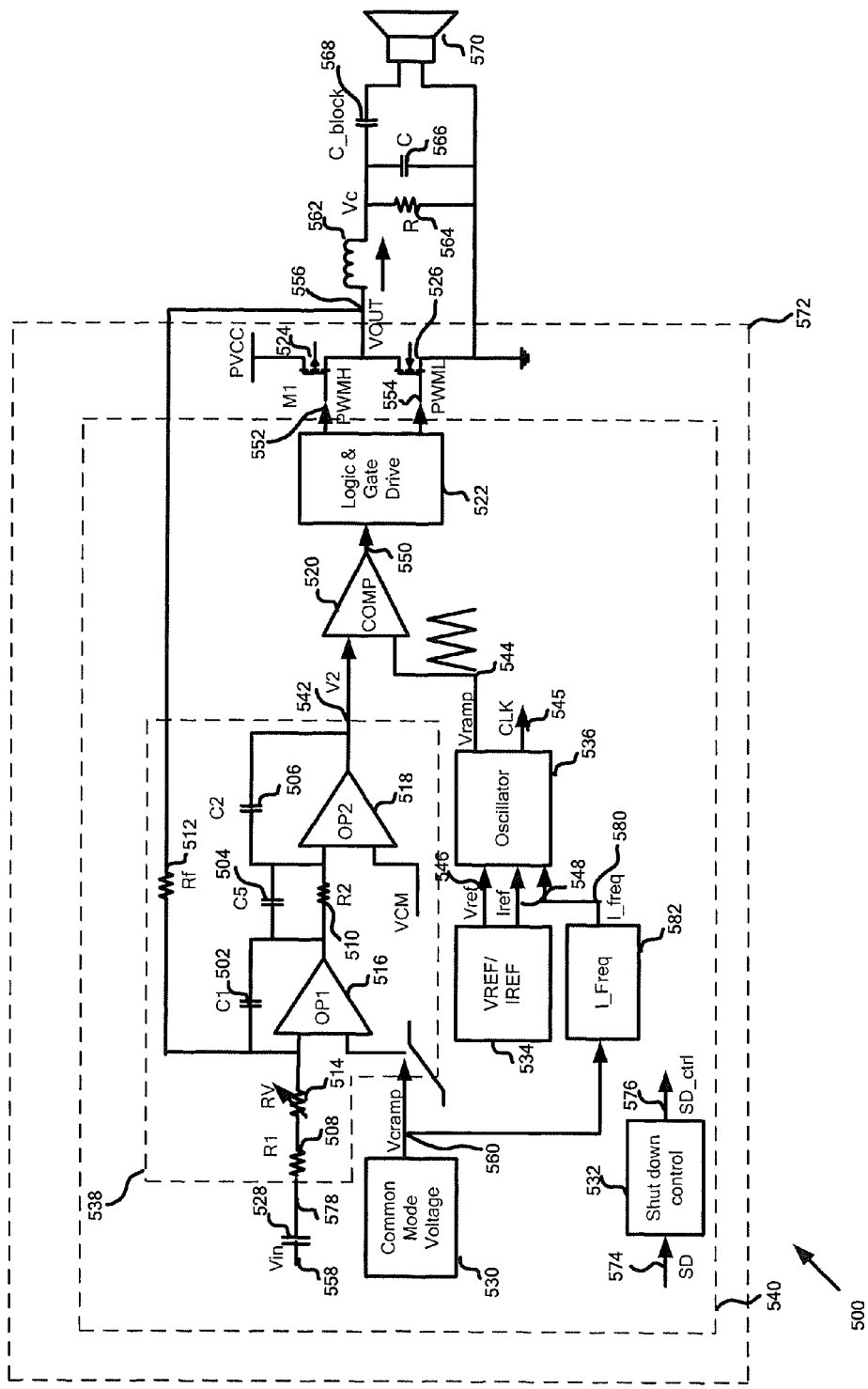
FIG. 5 is a simplified diagram showing an amplification system according to one embodiment of the present invention.

FIG. 5 is a simplified diagram showing an amplification system according to one embodiment of the present invention. This diagram is merely an example, which should not unduly limit the scope of the claims. One of ordinary skill in the art would recognize many variations, alternatives, and modifications.

The amplification system 500 includes six capacitors 502, 504, 506, 528, 566 and 568, four resistors 508, 510, 512 and 564, a variable resistor 514, an inductor 562, two operational amplifiers 516 and 518, a comparator 520, a logic and gate driver 522, two transistors 524 and 526, and an output load 570. Further, the amplification system 500 includes a common-mode voltage component 530, a shut down control component 532, a reference signal component 534, an oscillator 536, and a current generator 582.

For example, the capacitors 502, 504 and 506, the resistors 508, 510 and 512, and the operational amplifiers 516 and 518 are included in a second order loop filter 538. In another example, the capacitors 502, 504, 506 and 528, the resistors 508, 510 and 512, the variable resistor 514, the operational amplifiers 516 and 518, the comparator 520, the logic and gate driver 522, the common-mode voltage component 530, the reference signal component 534, the oscillator 536, the shut down control component 532, and the current generator 582 are included in a modulator 540. In yet another example, the modulator 540 and the transistors 524 and 526 are included in a Class-D amplifier 572.

For example, the capacitors 502, 504, 506, 528, 566 and 568, the resistors 508, 510, 512 and 564, the variable resistor 514, the inductor 562, the operational amplifiers 516 and 518, the comparator 520, the logic and gate driver 522, the transistors 524 and 526, and the output load 570 are the same as the capacitors 302, 304, 306, 328, 366 and 368, the resistors 308, 310, 312 and 364, the variable resistor 314, the inductor 362, the operational amplifiers 316 and 318, the comparator 320, the logic and gate driver 322, the transistors 324 and 326, and the output load 370, respectively. In another example, the common-mode voltage component 530, the shut down control component 532, the reference signal component 534, and the oscillator 536 are the same as the common-mode voltage component 330, the shut down control component 332, the reference signal component 334, and the oscillator 336, respectively. In yet another example, the transistor 524 is a P-channel MOSFET, or an N-channel MOSFET. In another example, the transistor 526 is an N-channel MOSFET.

According to one embodiment, an input audio signal 558 is received at the capacitor 528 that in response generates an input signal 578. For example, the loop filter 538 receives the input signal 578 and a signal 560 generated by the common-mode voltage component 530, and in response generates an output signal 542. In another example, at the comparator 520, the output signal 542 is compared with a ramping signal 544 (e.g., $V_{ramp}$) generated by the oscillator 536. In yet another example, the oscillator 536 generates the ramping signal 544 and a clock signal 545 based on a reference voltage signal 546 (e.g., Vref), a reference current signal 548 (e.g., Iref), and a current signal 580 (e.g., I_freq). In yet another example, the reference voltage signal 546 and the reference current signal 548 are generated by the reference signal component 534. In yet another example, the current signal 580 is generated by the current generator 582 in response to the signal 560 from the common-mode voltage component 530. In yet another example, the clock signal 545 is related to the switching frequency of the amplifier 572.

According to another embodiment, based on the comparison of the ramping signal 544 and the output signal 542, the comparator 520 outputs a modulation signal 550 to the logic and gate driver 522. For example, in response, the logic and gate driver 522 generates two gate drive signals 552 and 554. In another example, the transistors 524 and 526 receive the gate drive signals 552 and 554 respectively, and generate an output signal 556 to drive the output load 570. In yet another example, the output signal 556 is fed back through the resistor 512 to an input terminal of the operational amplifier 516. In yet another example, at the other input terminal, the operational amplifier 516 receives the signal 560 (e.g., $V_{cramp}$) generated by the common-mode voltage component 530. The signal 560 is often referred to as an input common-mode voltage level of the amplifier 572. In yet another example, the gate drive signals 552 and 554 are the same or different. In yet another example, the modulation signal 550 includes a PWM signal.

According to yet another embodiment, the variable resistor 514 changes its resistance from infinity to a low value (e.g., zero) based on a control signal (e.g., a gain ramping signal). For example, if the resistance of the resistor 514 is infinity, the gain of the amplifier 572 is zero, which is often referred to as the mute mode of the amplifier 572. In yet another example, the shut down control component 532 receives a shut down signal 574, and generates a shut down control signal 576 that powers down the amplification system 500.

In another embodiment, the ramping signal 544 has a triangle waveform. For example, the change rate (e.g., the slope of the triangle waveform) of the ramping signal 544 is high if the signal 560 (e.g., $V_{cramp}$) is low. Hence, the switching frequency of the amplifier 572 is high if the signal 560 (e.g., $V_{cramp}$) is low according to certain embodiments. In another example, the switching frequency of the amplifier 572 decreases as the signal 560 (e.g., $V_{cramp}$) increases. In yet another example, the pulse width of the output signal 556 is narrow at each switching cycle of the amplifier 572. Hence, even if the cycle skipping or burst switching discussed in FIGS. 3 and 4 still exists, it occurs in a high frequency range, instead of the audio frequency range, and in turn the undesired audible transients caused by the cycle skipping or burst switching is reduced, according to certain embodiments.

Figure 6:
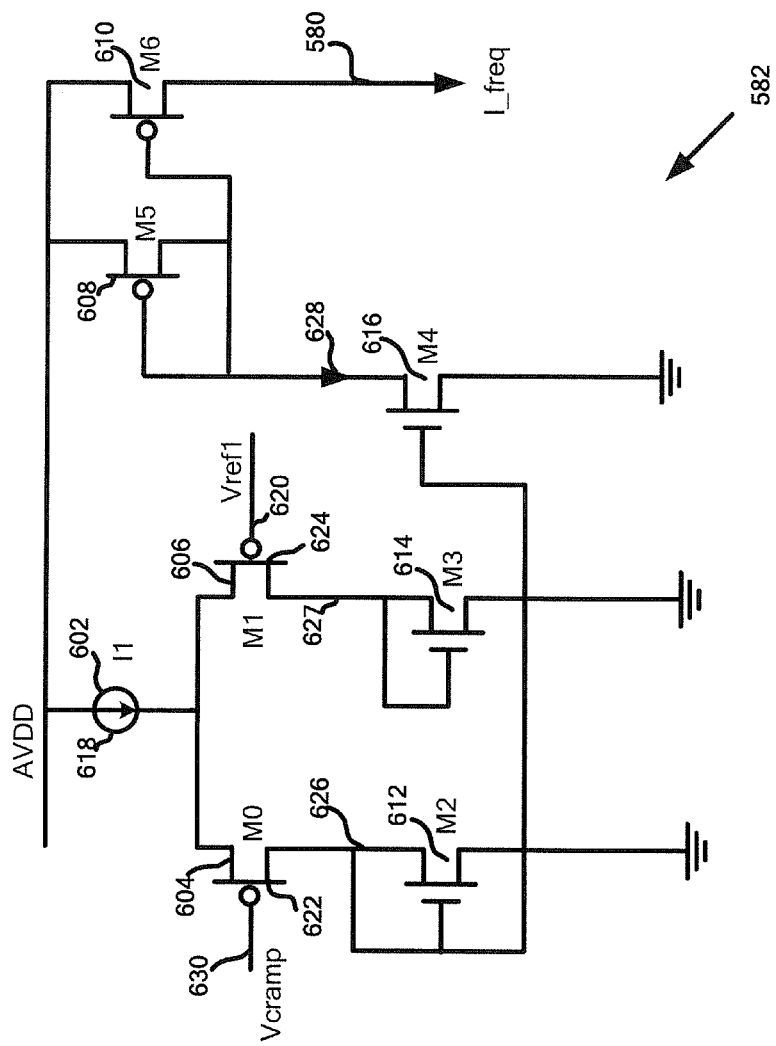
FIG. 6 is a simplified diagram showing certain components of the current generator as part of the amplification system according to one embodiment of the present invention.

FIG. 6 is a simplified diagram showing certain components of the current generator 582 as part of the amplification system 500 according to one embodiment of the present invention. This diagram is merely an example, which should not unduly limit the scope of the claims. One of ordinary skill in the art would recognize many variations, alternatives, and modifications. The current generator 582 includes a current source 602, seven transistors 604, 606, 608, 610, 612, 614 and 616. For example, the transistors 604, 606, 608 and 610 are p-channel MOSFETs. In another example, the transistors 612, 614 and 616 are n-channel MOSFETs.

In one embodiment, a current 618 (e.g., I1) from the current source 602 is received by the transistors 604 and 606. For example, the transistor 604 receives a signal 630 at a gate terminal 622, and is turned on or off by the signal 630. In another example, the signal 630 is related to the signal 560 (e.g., $V_{cramp}$). In yet another example, the transistor 606 receives a reference signal 620 (e.g., $V_{refl}$) at a gate terminal 624, and is turned on or off by the reference signal 620. In yet another example, a current 626 flows through the transistor 604 if the transistor 604 is turned on by the signal 630. In yet another example, a current 627 flows through the transistor 606 if the transistor 606 is turned on by the reference signal 620 (e.g., $V_{refl}$). In yet another example, the current 626 that also flows through the transistor 612 is mirrored by the transistor 616, with a predetermined ratio α, to generate a current 628 that flows through the transistor 608. In another example, the current 628 is mirrored by the transistor 610, with a predetermined ratio δ, to generate the current signal 580 (e.g., I_freq).

According to another embodiment, the current signal 580 is determined based on the following equation:

$$\text{I\_freq} = f(V_{cramp}, V_{refl}) \tag{1}$$

wherein Max(I_freq)=α×δ×I1 and Min(I_freq)=0. Additionally, I_freq represents the current signal 580, $V_{cramp}$ represents the voltage signal 560, $V_{refl}$ represents the reference signal 620, and I1 represents the current 618.

According to yet another embodiment, if the signal 630 is much lower than the reference signal 620 in magnitude, the current signal 580 (e.g., I_freq) is approximately equal to a maximum current (e.g., α×δ×I1) in magnitude. For example, if the signal 630 subtracted by the reference signal 620 decreases, the current signal 580 (e.g., I_freq) increases. In another example, the current signal 580 (e.g., I_freq) approaches the maximum current (e.g., α×δ×I1) in magnitude as a ratio of the reference signal 620 to the signal 630 approaches infinity in magnitude. In yet another example, α×δ is the ratio of the current mirrors.

According to yet another embodiment, if the signal 630 is much larger in magnitude than the reference signal 620, the current signal 580 (e.g., I_freq) is approximately zero. For example, if the signal 630 subtracted by the reference signal 620 increases, the current signal 580 (e.g., I_freq) decreases. In another example, the current signal 580 (e.g., I_freq) approaches zero in magnitude as the ratio of the reference signal 620 to the signal 630 approaches zero in magnitude.

Referring back to FIG. 5, the reference current signal 548 (e.g., Iref) and the current signal 580 (e.g., I_freq) are received by the oscillator 536 for affecting the switching frequency of the amplifier 572. Hence, the switching frequency of the amplifier 572 is related to the voltage signal 560 (e.g., $V_{cramp}$) based on Equation (1), according to certain embodiments. For example, the switching frequency of the amplifier 572 is determined based on the following equation:

$$F_{sw} = \beta \times (\text{Iref} + \text{I\_freq}) = \beta \times (\text{Iref} + f(V_{cramp}, V_{refl})) \tag{2}$$

where $F_{sw}$ represents the switching frequency of the amplifier 572, Iref represents the reference current signal 548, I_freq represents the current signal 580, $V_{cramp}$ represents the voltage signal 560, $V_{refl}$ represents the reference signal 620, and β represents a ratio. In another example, β is larger than zero.

In another embodiment, the switching frequency of the amplifier 572 decreases as the signal 580 (e.g., I_freq) decreases in magnitude. For example, the switching frequency of the amplifier 572 decreases as the signal 560 (e.g., $V_{cramp}$) increases in magnitude. In another example, the switching frequency is approximately equal to a minimum frequency of the amplifier 572 (e.g., $f_{min}$), if the current signal 580 (e.g., I_freq) is approximately zero in magnitude. In yet another example, if the magnitude of current signal 580 (for example, I_freq) is close to the magnitude of the current 618 (e.g., I1) multiplied by the ratio of the current mirrors, α×δ, the switching frequency of the amplifier 572 is much larger than the minimum frequency of the amplifier 572 (e.g., $f_{min}$)

Figure 7A:
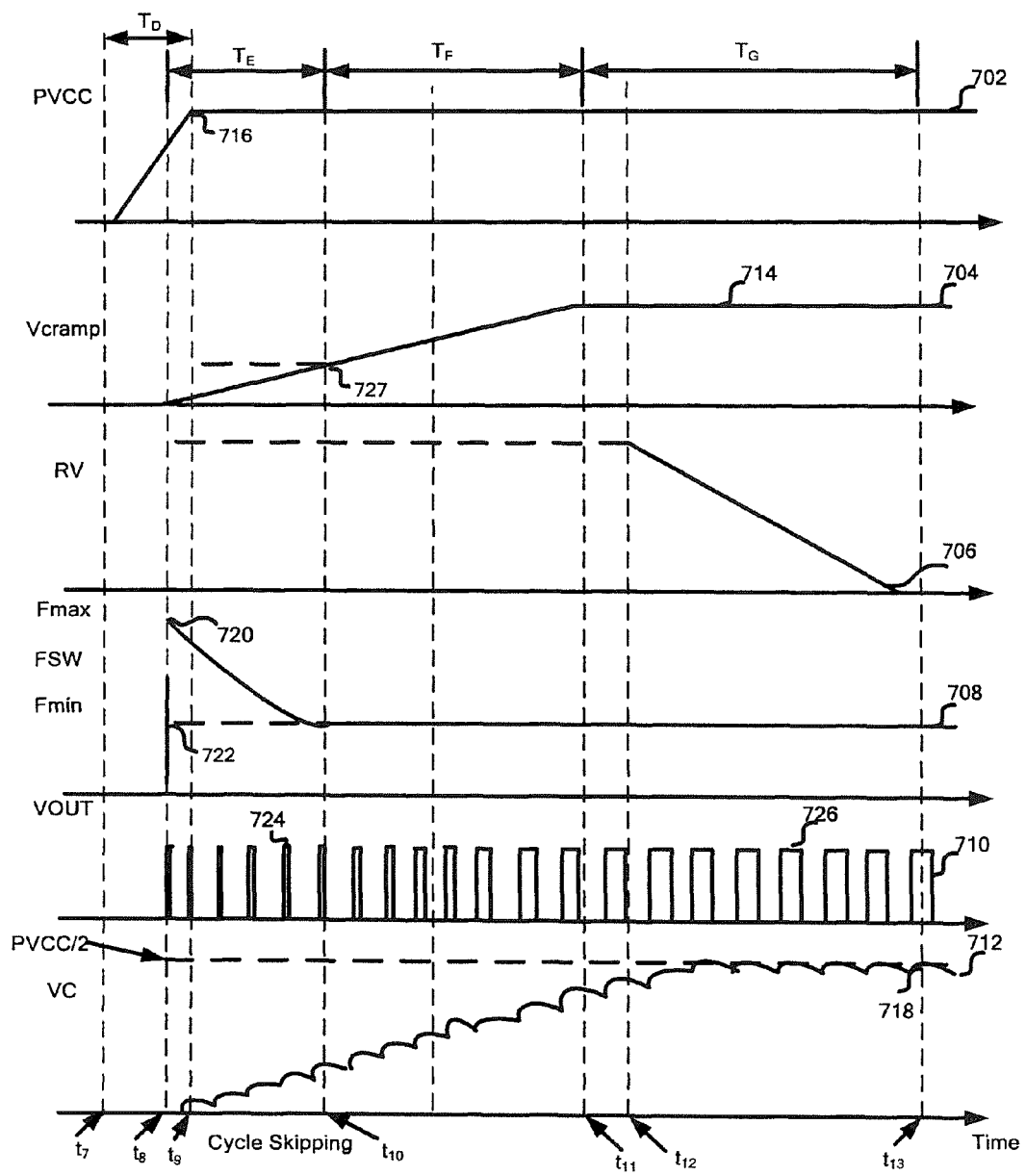
FIG. 7(*a*) is a simplified timing diagram for the amplification system during the process of powering up the amplification system according to an embodiment of the present invention.

FIG. 7(a) is a simplified timing diagram for the amplification system 500 during the process of powering up the amplification system 500 according to an embodiment of the present invention. This diagram is merely an example, which should not unduly limit the scope of the claims. One of ordinary skill in the art would recognize many variations, alternatives, and modifications.

The waveform 702 represents the positive power supply voltage as a function of time, the waveform 704 represents the signal 560 (e.g., $V_{cramp}$) as a function of time, and the waveform 706 represents the resistance of the variable resistor 514 (e.g., RV) as a function of time. Additionally, the waveform 708 represents the switching frequency of the amplifier 572 (e.g., $F_{SW}$) as a function of time, the waveform 710 represents the output signal 556 (e.g., $V_{out}$) as a function of time, and the waveform 712 represents the voltage across the capacitor 568 (e.g., $V_C$) as a function of time.

Four time periods $T_D$, $T_E$, $T_F$, and $T_G$ are shown in FIG. 7(a). The time period $T_D$ starts at time $t_7$ and ends at time $t_9$, the time period $T_E$ starts at time $t_8$ and ends at time $t_{10}$, the time period $T_F$ starts at time $t_{10}$ and ends at time $t_{11}$, and the time period $T_G$ starts at the time $t_{11}$ and ends at time $t_{13}$. For example, the time $t_{12}$ is within the time period $T_G$. In another example, $t_7 \leq t_8 \leq t_9 \leq t_{10} \leq t_{11} \leq t_{12} \leq t_{13}$. In yet another example, the voltage across the capacitor 568 (e.g., $V_C$) has a direct current (DC) component and an alternate current (AC) component (e.g., as shown by the waveform 712).

In one embodiment, the positive power supply voltage ramps up at the beginning of the time period $T_D$ (e.g., at the time $t_7$). For example, during the time period $T_D$, the positive power supply voltage increases from a low value (e.g., approximately zero at the time $t_7$) to a predetermined voltage 716 (e.g., PVCC at the time $t_9$) as shown by the waveform 702. In another example, the positive power supply voltage remains at the predetermined voltage 716 during the rest of the powering up process (e.g., as shown by the waveform 702). Hence, the transistors 524 and 526 can operate properly as switches according to certain embodiments.

Referring back to FIG. 6, if the signal 560 is lower in magnitude than the reference signal 620 (e.g., $V_{ref1}$), the current generator 582 generates the current signal 580 that is proportional to the current 618 in magnitude, and the switching frequency of the amplifier 572 is much higher than a minimum frequency. According to one embodiment, at the beginning of the time period $T_E$, the signal 560 (e.g., $V_{cramp}$) is lower than a threshold value 727 in magnitude (e.g., as shown by the waveform 704). For example, the reference signal 620 is equal to the threshold value 727 in magnitude. Hence, the switching frequency of the amplifier 572 is at a maximum frequency 720 that is much higher than a minimum frequency 722 in magnitude at the beginning of the time period $T_E$ (e.g., at the time $t_8$, as shown by the waveform 708) according to certain embodiments.

According to yet another embodiment, during the time period $T_E$, the signal 560 (e.g., $V_{cramp}$) ramps up (e.g., from approximately zero at the time $t_8$ to the threshold value 727 at the time $t_{10}$, as shown by the waveform 704). Hence, the switching frequency of the amplifier 572 decreases (e.g., from the maximum frequency 720 at the time $t_8$ to the minimum frequency 722 at the time $t_{10}$, as shown by the waveform 708) according to certain embodiments. For example, the magnitude of the signal 560 is lower than the threshold value 727 during the time period $T_E$. In another example, in response, the modulation signal 550 generated by comparing the output signal 542 with the ramping signal 544 (e.g., $V_{ramp}$) at the comparator 520 has narrow pulse widths. Hence, the pulse width of the output signal 556 (e.g., $V_{out}$) is narrow (e.g., the pulse width 724, as shown by the waveform 710), and increases over time according to certain embodiments. In yet another example, the DC component of the voltage across the capacitor 568 ramps up from a low value (e.g., approximately zero at the time $t_8$) as shown by the waveform 712.

As shown in FIG. 7(a), the switching frequency of the amplifier 572 remains higher than the minimum frequency 722 during the time period $T_E$. Hence, the pulse density of the output signal 556 is not low (e.g., as shown by the waveform 710), even though the cycle skipping still exists, according to certain embodiments. In another example, the transistors 524 and 526 are switched on or off at a frequency beyond the audio frequency range. Hence, the undesired audible transients are reduced compared with what is shown in FIG. 4, according to certain embodiments. In yet another example, the maximum frequency 720 is several times (e.g., twice or thrice) as much as the minimum frequency 722.

According to another embodiment, during the time period $T_F$, the signal 560 (e.g., $V_{cramp}$) continues to increase until reaching a predetermined value 714 (e.g., as shown by the waveform 704). For example, the switching frequency of the amplifier 572 remains at the minimum frequency 722 (e.g., as shown by the waveform 708). In another example, the pulse width of the output signal 556 (e.g., $V_{out}$) continues to increase over time (e.g., as shown by the waveform 710). In yet another example, the DC component of the voltage across the capacitor 568 continues to increase over time (e.g., as shown by the waveform 712).

According to yet another embodiment, during the time periods $T_E$ and $T_F$, the resistance of the variable resistor 514 (e.g., RV) is infinity (e.g., as shown by the waveform 706). Hence, the gain of the amplifier 572 is zero (e.g., the mute mode of the amplifier 572) during the time periods $T_E$ and $T_F$ according to certain embodiments.

According to yet another embodiment, during the time period $T_G$, the signal 560 remains at the predetermined value 714 (e.g., as shown by the waveform 704). For example, the switching frequency of the amplifier 572 remains at the minimum frequency 722 (e.g., as shown by the waveform 708). In another example, the pulse width (e.g., the pulse width 726) and the pulse density of the output signal 556 do not vary much during the time period $T_G$ (e.g., as shown by the waveform 710). In yet another example, the DC component of the voltage across the capacitor 568 (e.g., $V_C$) reaches a predetermined value 718 (e.g., PVCC/2 at the time $t_{13}$ as shown by the waveform 712). In yet another example, the resistance of the variable resistor 514 (e.g., RV) decreases from infinity (e.g., at the time $t_{12}$) to a low value (e.g., approximately zero at the time $t_{13}$ as shown by the waveform 706). Hence, the amplifier 572 operates to amplify the input audio signal 558 (e.g., after the time $t_{12}$) according to certain embodiments.

Figure 7B:
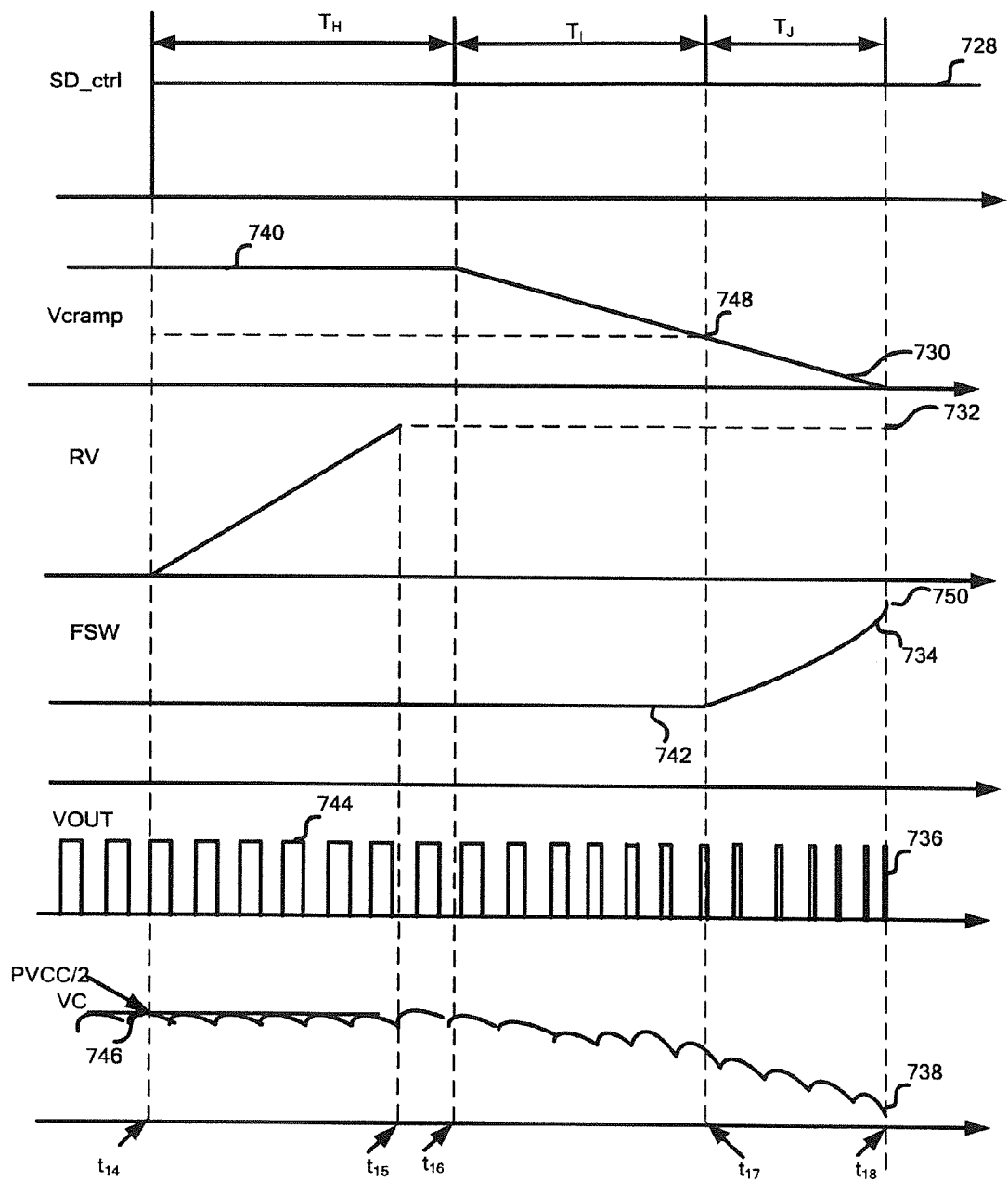

FIG. 7(b) is a simplified timing diagram for the amplification system 500 during the process of powering down or shutting down the amplification system 500 according to an embodiment of the present invention. This diagram is merely an example, which should not unduly limit the scope of the claims. One of ordinary skill in the art would recognize many variations, alternatives, and modifications.

The waveform 728 represents the shut down control signal 576 as a function of time, the waveform 730 represents the signal 560 (e.g., $V_{cramp}$) as a function of time, and the waveform 732 represents the resistance of the variable resistor 514 (e.g., RV) as a function of time. Additionally, the waveform 734 represents the switching frequency of the amplifier 572 (e.g., $F_{SW}$) as a function of time, the waveform 736 represents the output signal 556 (e.g., $V_{out}$) as a function of time, and the waveform 738 represents the voltage across the capacitor 568 (e.g., $V_C$) as a function of time.

Three time periods $T_H$, $T_I$, and $T_J$ are shown in FIG. 7(b). The time period $T_H$ starts at time $t_{14}$ and ends at time $t_{16}$, the time period $T_I$ starts at time $t_{16}$ and ends at time $t_{17}$, and the time period $T_J$ starts at time $t_{17}$ and ends at time $t_{18}$. For example, the time $t_{15}$ is within the time period $T_H$. In another example, $t_{14} \leq t_{15} \leq t_{16} \leq t_{17} \leq t_{18}$.

In one embodiment, at the beginning of the time period $T_H$ (e.g., at the time $t_{14}$), the shut down control signal 576 changes from a logic low level to a logic high level (e.g., as shown by the waveform 728). For example, the shut down control signal 576 remains at the logic high level during the rest of the powering down process (e.g., as shown by the waveform 728).

According to another embodiment, during the time period $T_H$, the signal 560 (e.g., $V_{cramp}$) remains at a predetermined value 740 (e.g., as shown by the waveform 730). For example, the switching frequency of the amplifier 572 (e.g., $F_{SW}$) remains at a minimum frequency 742 (e.g., as shown by the waveform 734). In another example, the pulse width (e.g., the pulse width 744) and the pulse density of the output signal 556 (e.g., $V_{out}$) do not change much during the time period $T_H$ (e.g., as shown by the waveform 736). In yet another example, the DC component of the voltage across the capacitor 568 (e.g., $V_C$) remains at approximately a predetermined value 746 (e.g., as shown by the waveform 738). In yet another example, the resistance of the variable resistor 514 (e.g., RV) increases from a low value (e.g., approximately zero at the time $t_{14}$) to infinity (e.g., at the time $t_{15}$), and remains at infinity for the rest of the powering down process (e.g., as shown by the waveform 732). Hence, the gain of the amplifier 572 reduces to zero (e.g., entering the mute mode) at the time $t_{15}$, and keeps at zero for the rest of the powering down process according to certain embodiments.

According to yet another embodiment, during the time period $T_1$, the signal 560 (e.g., $V_{cramp}$) reduces from the predetermined value 740 (e.g., at the time $t_{16}$) to a threshold value 748 (e.g., at the time $t_{17}$) as shown by the waveform 730. For example, the switching frequency (e.g., $F_{SW}$) remains at the minimum frequency 742 during the time period $T_I$ (e.g., as shown by the waveform 734). In another example, the pulse width of the output signal 556 (e.g., $V_{out}$) decreases during the time period $T_1$ (e.g., as shown by the waveform 736). In yet another example, the DC component of the voltage across the capacitor 568 (e.g., $V_C$) decreases (e.g., from the predetermined value 746) during the time period $T_I$ (e.g., as shown by the waveform 738). In yet another example, the predetermined value 740 is equal to the predetermined value 714.

According to yet another embodiment, during the time period $T_J$, the signal 560 (e.g., $V_{cramp}$) continue to decrease from the threshold value 748 (e.g., at the time $t_{17}$) to a low value (e.g., approximately zero at the time $t_{18}$) as shown by the waveform 730. For example, the switching frequency (e.g., $F_{SW}$) of the amplifier 572 increases from the minimum frequency 742 (e.g., at the time $t_{17}$) to a maximum frequency 750 (e.g., at the time $t_{18}$) as shown by the waveform 734. In another example, the pulse width of the output signal 556 (e.g., $V_{out}$) continues to decrease during the time period $T_J$ (e.g., as shown by the waveform 736). In yet another example, the DC component of the voltage across the capacitor 568 (e.g., $V_C$) decreases to a low value (e.g., approximately zero at the time $t_{18}$) as shown by the waveform 738.

As the switching frequency of the amplifier 572 is no less than the minimum frequency 722 during the time period $T_J$, the pulse density of the output signal 556 is not low (e.g., as shown by the waveform 736) even though the cycle skipping still exists, according to certain embodiments. For example, the transistors 524 and 526 are switched on or off at a frequency beyond the audio frequency range, and hence the undesired audible transients are reduced. In another example, the maximum frequency 750 is several times (e.g., twice or thrice) as much as the minimum frequency 742. In yet another example, the maximum frequency 750 is equal to the maximum frequency 720, and the minimum frequency 742 is equal to the minimum frequency 722.

Figure 8:
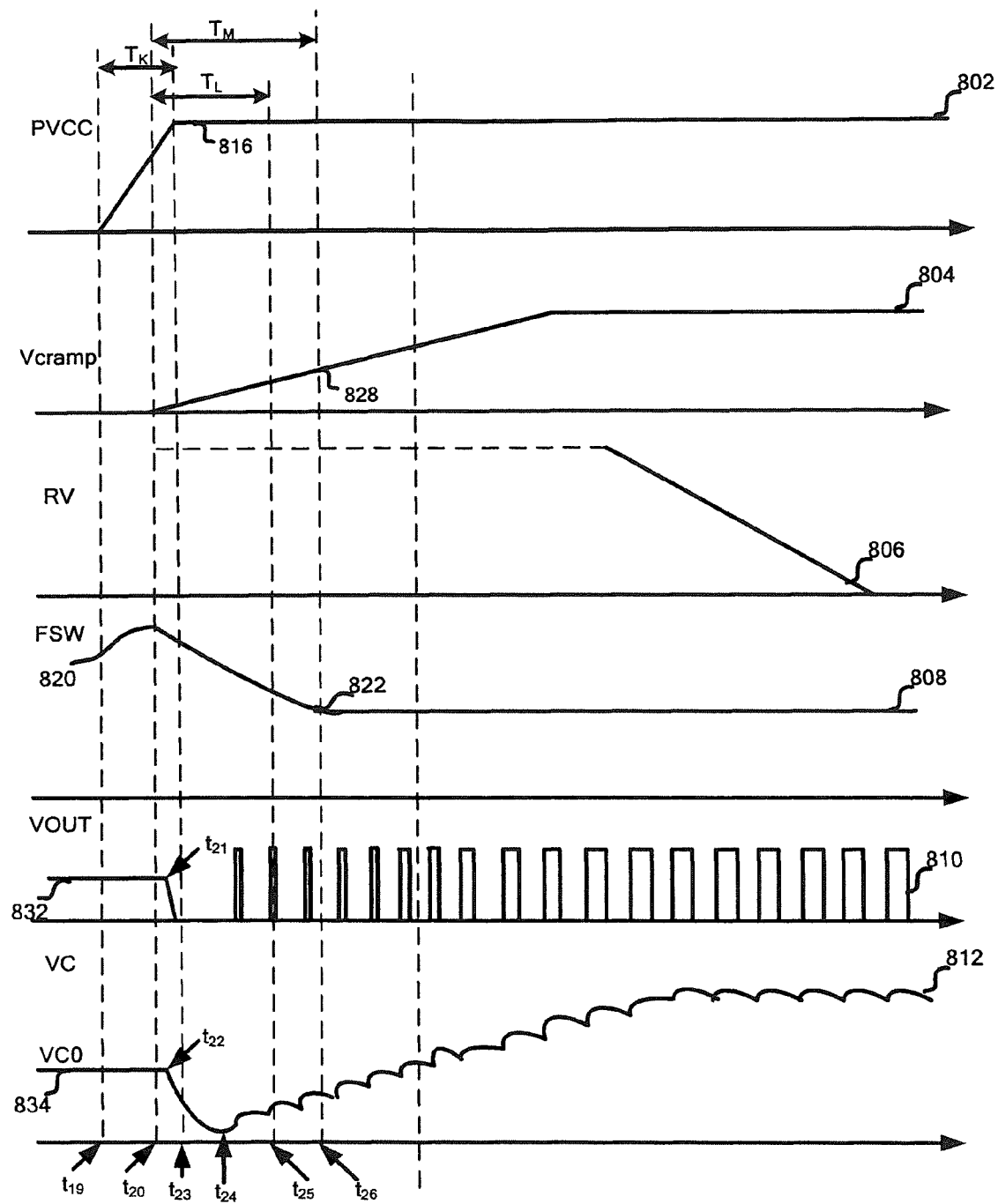
FIG. 8 is a simplified timing diagram for the amplification system during the process of powering up the amplification system according to another embodiment of the present invention.

FIG. 8 is a simplified timing diagram for the amplification system 500 during the process of powering up the amplification system 500 according to another embodiment of the present invention. This diagram is merely an example, which should not unduly limit the scope of the claims. One of ordinary skill in the art would recognize many variations, alternatives, and modifications.

The waveform 802 represents the positive power supply voltage as a function of time, the waveform 804 represents the signal 560 (e.g., $V_{cramp}$) as a function of time, and the waveform 806 represents the resistance of the variable resistor 514 (e.g., RV) as a function of time. Additionally, the waveform 808 represents the switching frequency of the amplifier 572 (e.g., $F_{SW}$) as a function of time, the waveform 810 represents the output signal 556 (e.g., $V_{out}$) as a function of time, and the waveform 812 represents the voltage across the capacitor 568 (e.g., $V_C$) as a function of time. For example, the waveform 802 is similar to the waveform 702, the waveform 804 is similar to the waveform 704, the waveform 806 is similar to the waveform 706, and the waveform 808 is similar to the waveform 708.

Three time periods $T_K$, $T_L$ and $T_M$ are shown in FIG. 8. The time period $T_K$ starts at time $t_{19}$ and ends at time $t_{23}$, the time period $T_L$ starts at time $t_{20}$ and ends at time $t_{25}$, and the time period $T_M$ starts at the time $t_{20}$ and ends at time $t_{26}$. For example, $t_{21}$, $t_{22}$ and $t_{24}$ are within the time period $T_M$ and the time period $T_L$. In another example, the time period $T_L$ falls within the time period $T_M$. In another example, $t_{19} \leq t_{20} \leq t_{21} \leq t_{22} \leq t_{23} \leq t_{24} \leq t_{25} \leq t_{26}$. In another example, the voltage across the capacitor 568 (e.g., $V_C$) has a direct current (DC) component and an alternate current (AC) component (e.g., as shown by the waveform 812).

In one embodiment, the positive power supply voltage ramps up at the beginning of the time period $T_K$ (e.g., at the time $t_{19}$). For example, during the time period $T_K$, the positive power supply voltage increases from a low value (e.g., approximately zero at the time $t_{19}$) to a predetermined voltage 816 (e.g., PVCC at the time $t_{21}$) as shown by the waveform 802.

According to another embodiment, during the time period $T_M$, the signal 560 (e.g., $V_{cramp}$) ramps up (e.g., from zero at the time $t_{20}$ to a threshold value 828 at the time $t_{26}$) as shown by the waveform 804. For example, the switching frequency of the amplifier 572 decreases (e.g., from a maximum frequency 820 at the time $t_{20}$ to a minimum frequency 822 at the time $t_{26}$) as shown by the waveform 808. In another example, the output signal 556 (e.g., $V_{out}$) has a predetermined value 832 that is larger than zero at the beginning of the time period $T_M$ (e.g., as shown by the waveform 810). In yet another example, the voltage across the capacitor 568 is equal to a predetermined value 834 (e.g., $V_{c0}$>0) at the beginning of the time period $T_M$ as shown by the waveform 812.

According to yet another embodiment, during the time period $T_L$, the output signal 556 (e.g., $V_{out}$) reduces from the predetermined value 832 (e.g., at the time $t_{21}$) to a low value (e.g., zero) as shown by the waveform 810. For example, the voltage across the capacitor 568 reduces from the predetermined value 834 (e.g., at the time $t_{22}$) to a low value (e.g. approximately zero at the time $t_{24}$), and then ramps up (e.g., as shown by the waveform 812). In another example, the abrupt change in the voltage across the capacitor 568 during the time period $T_L$ causes the undesired audible transients (e.g., click and/or pop). A scheme to reduce the undesired audible transients caused by the non-zero output signal 556 at the beginning of the powering up process is desired.

Figure 9:
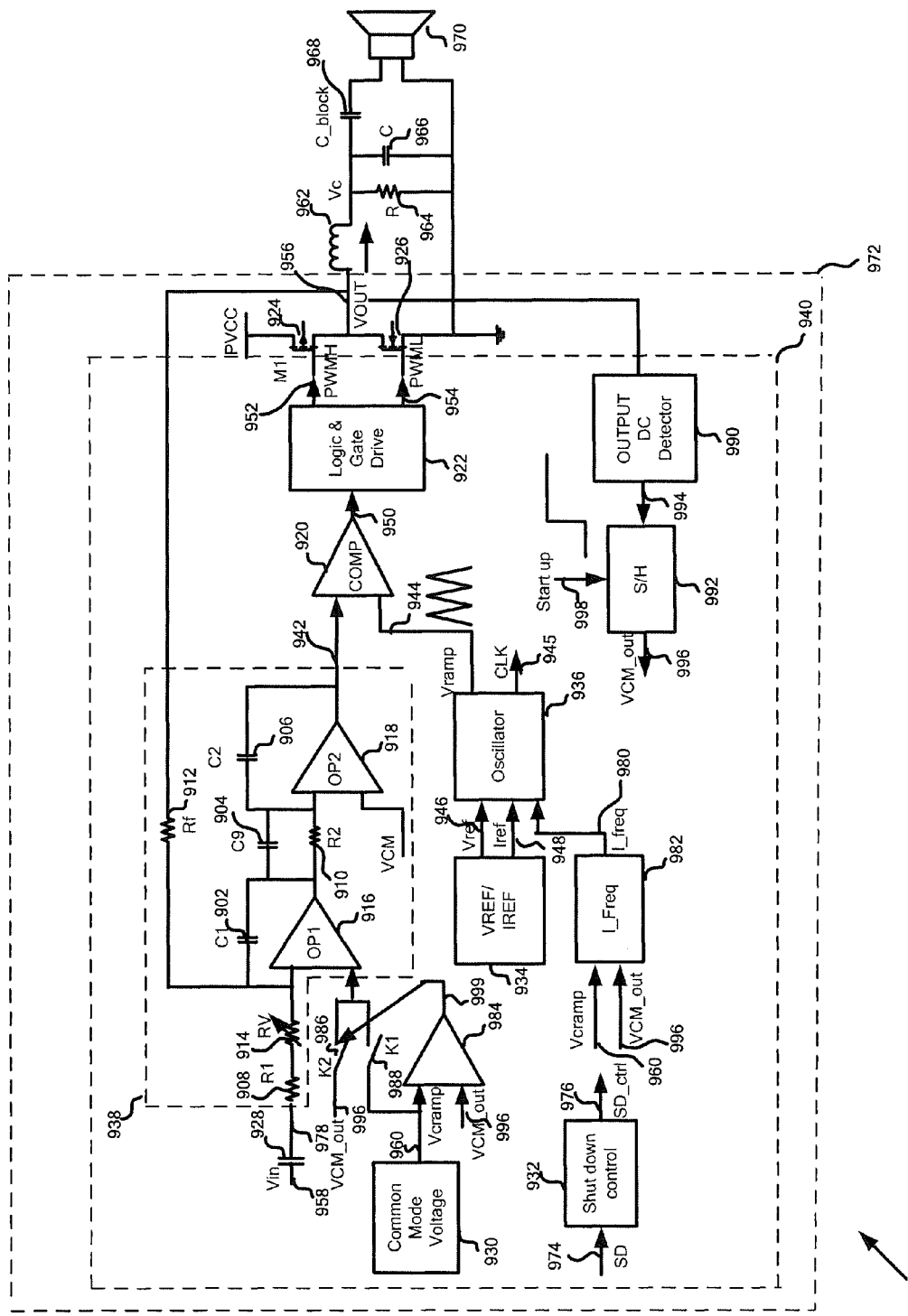
FIG. 9 is a simplified diagram showing an amplification system according to one embodiment of the present invention.

FIG. 9 is a simplified diagram showing an amplification system according to one embodiment of the present invention. This diagram is merely an example, which should not unduly limit the scope of the claims. One of ordinary skill in the art would recognize many variations, alternatives, and modifications.

The amplification system 900 includes six capacitors 902, 904, 906, 928, 966 and 968, four resistors 908, 910, 912 and 964, a variable resistor 914, an inductor 962, three operational amplifiers 916, 918 and 984, a comparator 920, a logic and gate driver 922, two transistors 924 and 926, a common-mode voltage component 930, a shut down control component 932, a reference signal component 934, an oscillator 936, a current generator 982, and an output load 970. Further, the amplification system 900 includes two switches 986 and 988, an output DC detector 990, and a sample and hold component 992.

For example, the capacitors 902, 904 and 906, the resistors 908, 910 and 912, and the operational amplifiers 916 and 918 are included in a second order loop filter 938. In another example, the capacitors 902, 904, 906 and 928, the resistors 908, 910 and 912, the variable resistor 914, the operational amplifiers 916, 918 and 984, the comparator 920, the logic and gate driver 922, the common-mode voltage component 930, the reference signal component 934, the oscillator 936, the shut down control component 932, the current generator 982, the switches 986 and 988, the output DC detector 990, and the sample and hold component 992 are included in a modulator 940. In yet another example, the modulator 940 and the transistors 924 and 926 are included in a Class-D amplifier 972. In yet another example, the transistor 924 is a P-channel MOSFET, or an N-channel MOSFET. In another example, the transistor 926 is an N-channel MOSFET.

For example, the capacitors 902, 904, 906, 928, 966 and 968, the resistors 908, 910, 912 and 964, the variable resistor 914, the inductor 962, the operational amplifiers 916 and 918, the comparator 920, the logic and gate driver 922, the transistors 924 and 926, the output load 970, the common-mode voltage component 930, the shut down control component 932, the reference signal component 934, and the oscillator 936 are the same as the capacitors 302, 304, 306, 328, 366 and 368, the resistors 308, 310, 312 and 364, the variable resistor 314, the inductor 362, the operational amplifiers 316 and 318, the comparator 320, the logic and gate driver 322, the transistors 324 and 326, the output load 370, the common-mode voltage component 330, the shut down control component 332, the reference signal component 334, and the oscillator 336, respectively. In another example, the capacitors 902, 904, 906, 928, 966 and 968, the resistors 908, 910, 912 and 964, the variable resistor 914, the inductor 962, the operational amplifiers 916 and 918, the comparator 920, the logic and gate driver 922, the transistors 924 and 926, the output load 970, the common-mode voltage component 930, the shut down control component 932, the reference signal component 934, the oscillator 936, and the current generator 982 are the same as the capacitors 502, 504, 506, 528, 566 and 568, the resistors 508, 510, 512 and 564, the variable resistor 514, the inductor 562, the operational amplifiers 516 and 518, the comparator 520, the logic and gate driver 522, the transistors 524 and 526, the output load 570, the common-mode voltage component 530, the shut down control component 532, the reference signal component 534, the oscillator 536, and the current generator 582, respectively.

According to another embodiment, an input audio signal 958 is received at the capacitor 928 that in response generates an input signal 978. For example, the loop filter 938 receives the input signal 978 and a signal 960 generated by the common-mode voltage component 930, and in response generates an output signal 942. In another example, at the comparator 920, the output signal 942 is compared with a ramping signal 944 (e.g., $V_{ramp}$) generated by the oscillator 936. In yet another example, the oscillator 936 generates the ramping signal 944 and a clock signal 945 based on a reference voltage signal 946 (e.g., Vref), a reference current signal 948 (e.g., Iref), and a current signal 980 (e.g., I_freq). In yet another example, the reference voltage signal 946 and the reference current signal 948 are generated by the reference signal component 934. In yet another example, the current signal 980 is generated by the current generator 982 based on the signal 960 (e.g., $V_{cramp}$) from the common-mode voltage component 930 and a signal 996 (e.g., VCM_out) from the sample and hold component 992. In yet another example, the clock signal 945 is related to the switching frequency of the amplifier 972. In yet another example, the ramping signal 944 has a triangle waveform.

According to another embodiment, based on the comparison of the ramping signal 944 and the output signal 942, the comparator 920 outputs a modulation signal 950 to the logic and gate driver 922. For example, in response, the logic and gate driver 922 generates two gate drive signals 952 and 954. In another example, the transistors 924 and 926 receive the gate drive signals 952 and 954 respectively, and generate an output signal 956 to drive the output load 970. In yet another example, the output signal 956 is fed back through the resistor 912 to an input terminal of the operational amplifier 916. In yet another example, at the other input terminal, the operational amplifier 916 receives either the signal 960 (e.g., $V_{cramp}$) from the common-mode voltage component 930 or the signal 996 (e.g., VCM_out) from the sample and hold component 992 based on the status of the switches 986 and 988. In yet another example, the gate drive signals 952 and 954 are the same or different. In yet another example, the modulation signal 950 includes a PWM signal.

According to yet another embodiment, the variable resistor 914 changes its resistance from infinity to a low value (e.g., zero) based on a control signal (e.g., a gain ramping signal). For example, if the resistance of the resistor 914 is infinity, the gain of the amplifier 972 is zero, which is often referred to as the mute mode of the amplifier 972. In yet another example, the shut down control component 932 receives a shut down signal 974, and generates a shut down control signal 976 that powers down the amplification system 900.

In another embodiment, at the beginning of the process of powering up the amplification system 900, the output DC detector 990 receives the output signal 956 of the amplifier 972, and generates a signal 994. For example, in response to a start up signal 998 that indicates powering up of the amplification system 900, the sample and hold component 992 samples the signal 994, and outputs the signal 996 (e.g., VCM_out).

In another example, the operational amplifier 984 receives the signal 996 (e.g., VCM_out) and the signal 960 (e.g., $V_{cramp}$), and generates in response a control signal 999. In yet another example, if the signal 996 (e.g., VCM_out) is larger than the signal 960 (e.g., $V_{cramp}$) in magnitude, the switch 986 is closed in response to the control signal 999, and the signal 996 is received by the operational amplifier 916. In yet another example, if the signal 996 (e.g., VCM_out) is no larger than the signal 960 (e.g., $V_{cramp}$) in magnitude, the switch 988 is closed in response to the control signal 999, and the signal 960 is received by the operational amplifier 916. In yet another example, the current generator 982 receives the signal 996 (e.g., VCM_out) and the signal 960 (e.g., $V_{cramp}$) for generating the current signal 980 to affect the switching frequency of the amplifier 972. In yet another example, the signal 994 represents the DC component of the output signal 956. In yet another example, the signal 996 (e.g., VCM_out) has a constant magnitude until the sample and hold component 992 samples the signal 994 again.

Figure 10:
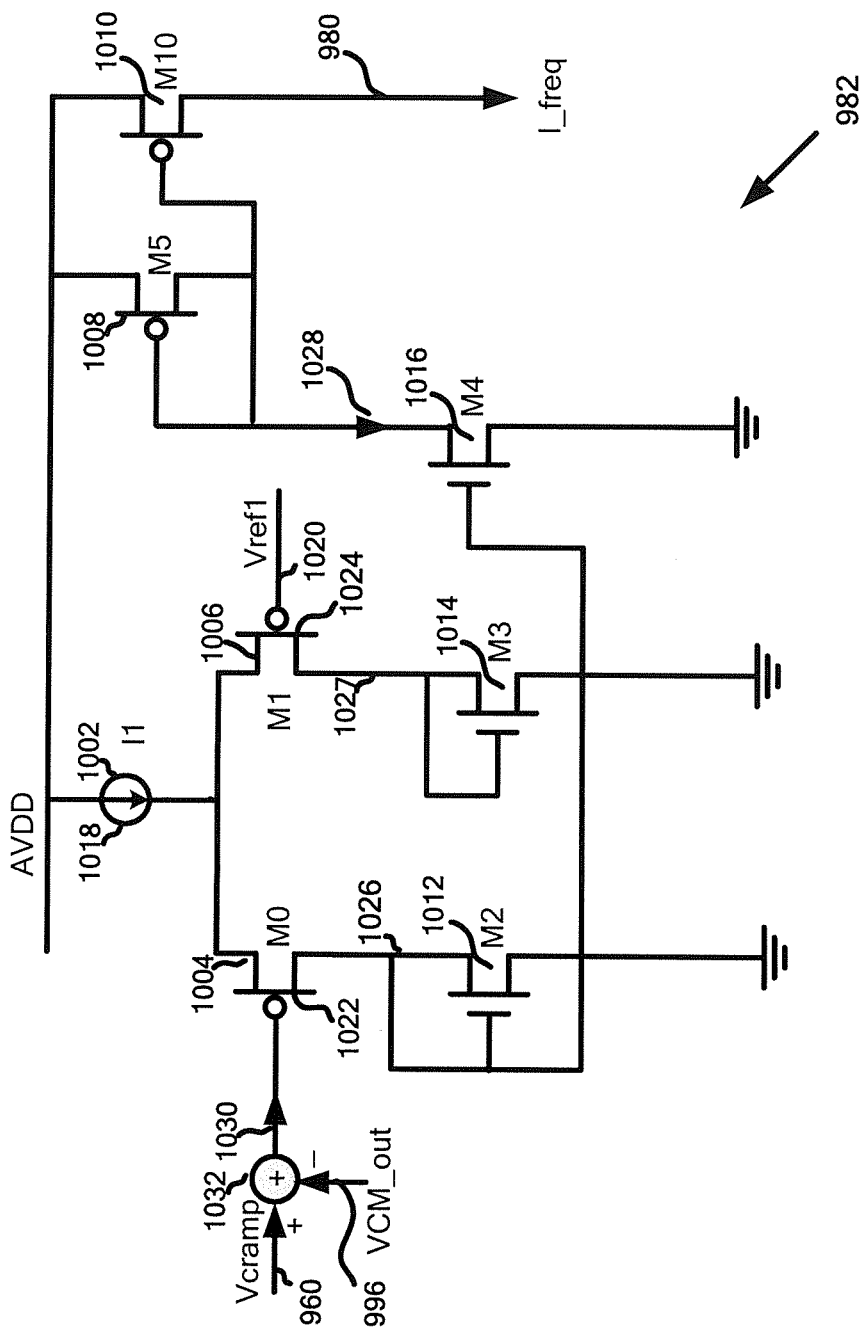
FIG. 10 is a simplified diagram showing certain components of the current generator as part of the amplification system according to one embodiment of the present invention.

FIG. 10 is a simplified diagram showing certain components of the current generator 982 as part of the amplification system 900 according to one embodiment of the present invention. This diagram is merely an example, which should not unduly limit the scope of the claims. One of ordinary skill in the art would recognize many variations, alternatives, and modifications.

The current generator 982 includes a current source 1002, seven transistors 1004, 1006, 1008, 1010, 1012, 1014 and 1016. For example, the transistors 1004, 1006, 1008 and 1010 are p-channel MOSFETs. In another example, the transistors 1012, 1014 and 1016 are n-channel MOSFETs.

In one embodiment, a current 1018 (e.g., I1) from the current source 1002 is received by the transistors 1004 and 1006. For example, the transistor 1004 receives a signal 1030 at a gate terminal 1022, and is turned on or off by the signal 1030. In another example, the signal 1030 is generated at an arithmetic component 1032 by subtracting the signal 996 (e.g., VCM_out) from the signal 960 (e.g., $V_{cramp}$). In yet another example, the transistor 1006 receives a signal 1020 (e.g., $V_{ref1}$) at a gate terminal 1024, and is turned on or off by the signal 1020. In yet another example, a current 1026 flows through the transistor 1004 if the transistor 1004 is turned on by the signal 1030. In yet another example, a current 1027 flows through the transistor 1006 if the transistor 1006 is turned on by the reference signal 1020 (e.g., $V_{ref1}$). In yet another example, the current 1026 that also flows through the transistor 1012 is mirrored by the transistor 1016, with a predetermined ratio c, to generate a current 1028 that flows through the transistor 1008. In another example, the current 1028 is mirrored by the transistor 1010, with a predetermined ratio φ, to generate the current signal 980 (e.g., I_freq).

According to another embodiment, the current signal 980 is determined based on the following equation:

$$I\_freq = f(V_{cramp} - VCM\_out, V_{ref1}) \quad (3)$$

wherein Max(I_freq)=ε×φ×I1 and Min(I_freq)=0. Additionally, I_freq represents the current signal 980, $V_{cramp}$ represents the voltage signal 960, VCM_out represents the signal 996, $V_{ref1}$ represents the reference signal 1020, and I1 represents the current 1018.

According to yet another embodiment, if the signal 1030 is much lower than the reference signal 1020 in magnitude, the current signal 980 (e.g., I_freq) is approximately equal to a maximum current (e.g., ε×φ×I1) in magnitude. For example, if the signal 1030 subtracted by the reference signal 1020 decreases, the current signal 980 (e.g., I_freq) increases. In another example, the current signal 980 (e.g., I_freq) approaches the maximum current (e.g., ε×φ×I1) in magnitude as a ratio of the reference signal 1020 to the signal 1030 approaches infinity in magnitude. In yet another example, ε×φ is the ratio of the current mirrors.

According to yet another embodiment, if the signal 1030 is much larger than the reference signal 1020 in magnitude, the current signal 980 is approximately zero. For example, if the signal 1030 subtracted by the reference signal 1020 increases, the current signal 980 (e.g., I_freq) decreases. In another example, the current signal 980 (e.g., I_freq) approaches zero in magnitude as a ratio of the reference signal 1020 to the signal 1030 approaches zero in magnitude.

Referring back to FIG. 9, the reference current signal 948 (e.g., Iref) and the current signal 980 (e.g., I_freq) are received by the oscillator 936 for affecting the switching frequency of the amplifier 972. Hence, the switching frequency of the amplifier 972 is related to the voltage signal 960 based on Equation (3), according to certain embodiments. For example, the switching frequency of the amplifier 972 is determined based on the following equation:

$$F_{sw} = \beta \times (Iref + I\_freq) = \beta \times (Iref + f(V_{cramp} - VCM\_out, V_{ref1})) \quad (4)$$

where $F_{sw}$ represents the switching frequency of the amplifier 972, Iref represents the reference current signal 948, I_freq represents the current signal 980, $V_{cramp}$ represents the voltage signal 960, $V_{ref1}$ represents the reference signal 1020, VCM_out represents the signal 996, and β represents a ratio. In another example, the switching frequency of the amplifier 972 decreases as the signal 980 (e.g., I_freq) decreases in magnitude. Hence, the switching frequency of the amplifier 972 decreases as the magnitude of the voltage signal 960 subtracted by the signal 996 increases. In yet another example, β is larger than zero. In yet another example, the switching frequency is much larger than a minimum frequency of the amplifier 972 if the current signal 980 (e.g., I_freq) is proportional (e.g., equal) to the current 1018 in magnitude. In yet another example, the switching frequency is much larger than a minimum frequency of the amplifier 972 if the current signal 980 (e.g., I_freq) is approximately equal to the current 1018 in magnitude. In yet another example, the switching frequency is approximately equal to the minimum frequency of the amplifier 972 if the current signal 980 (e.g., I_freq) is approximately zero in magnitude.

Figure 11A:
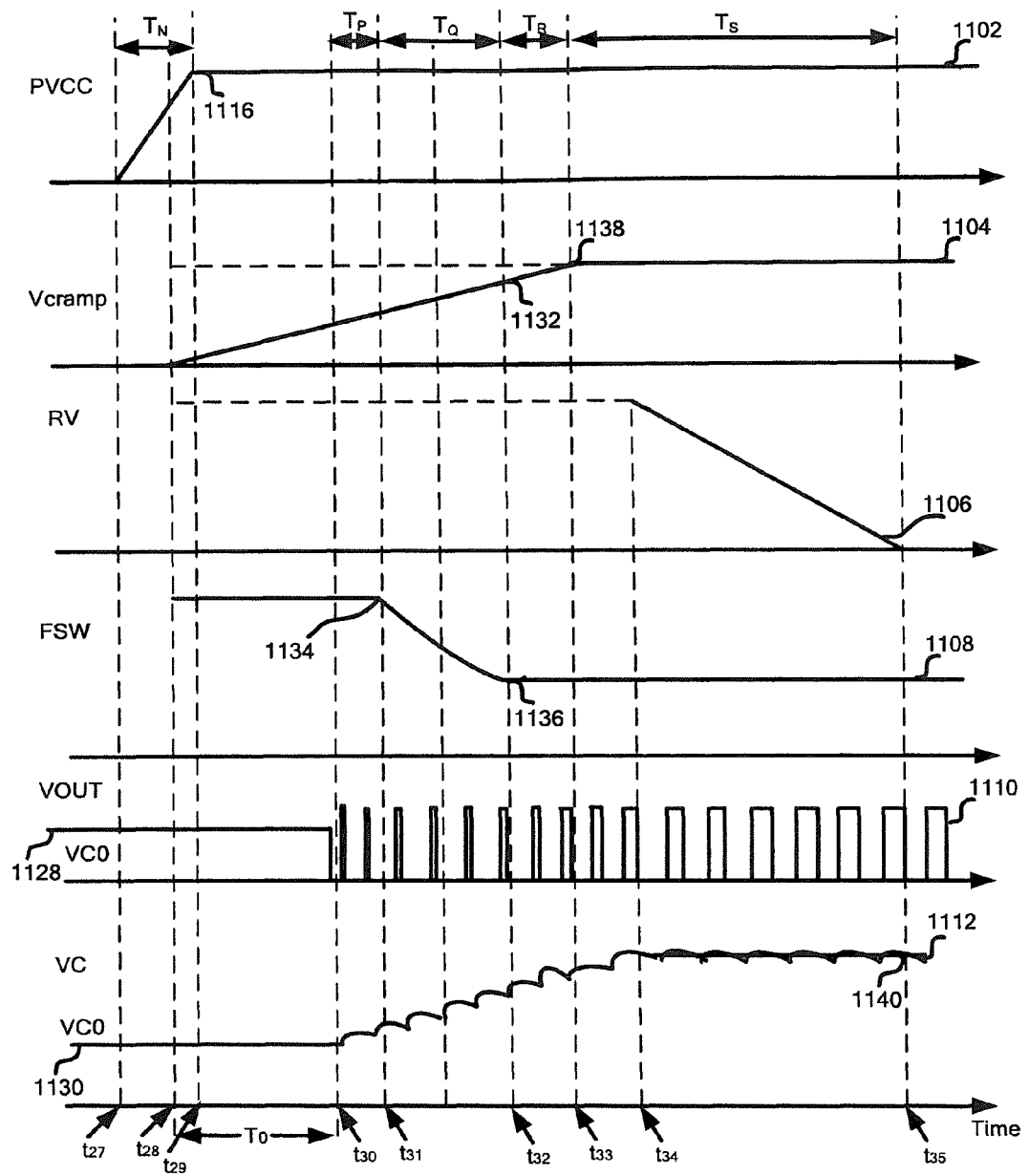
FIG. 11(*a*) is a simplified timing diagram for the amplification system during the process of powering up the amplification system according to an embodiment of the present invention.

FIG. 11(*a*) is a simplified timing diagram for the amplification system 900 during the process of powering up the amplification system 900 according to an embodiment of the present invention. This diagram is merely an example, which should not unduly limit the scope of the claims. One of ordinary skill in the art would recognize many variations, alternatives, and modifications.

The waveform 1102 represents the positive power supply voltage as a function of time, the waveform 1104 represents the signal 960 (e.g., $V_{cramp}$) as a function of time, and the waveform 1106 represents the resistance of the variable resistor 914 (e.g., RV) as a function of time. Additionally, the waveform 1108 represents the switching frequency of the amplifier 972 (e.g., $F_{SW}$) as a function of time, the waveform 1110 represents the output signal 956 (e.g., $V_{out}$) as a function of time, and the waveform 1112 represents the voltage across the capacitor 968 (e.g., $V_C$) as a function of time.

Six time periods $T_N$, $T_O$, $T_P$, $T_Q$, $T_R$ and $T_S$ are shown in FIG. 11(*a*). The time period $T_N$ starts at time $t_{27}$ and ends at time $t_{29}$, the time period $T_O$ starts at time $t_{28}$ and ends at time $t_{30}$, and the time period $T_P$ starts at time $t_{30}$ and ends at time $t_{31}$. Further, the time period $T_Q$ starts at the time $t_{31}$ and ends at time $t_{32}$, the time period $T_R$ starts at time $t_{32}$ and ends at time $t_{33}$, and the time period $T_S$ starts at time $t_{33}$ and ends at time $t_{35}$. For example, the time $t_{34}$ is within the time period $T_S$. In another example, $t_{27} \leq t_{28} \leq t_{29} \leq t_{30} \leq t_{31} \leq t_{32} \leq t_{33} \leq t_{34} \leq t_{35}$. In yet another example, the voltage across the capacitor 968 (e.g., $V_C$) has a direct current (DC) component and an alternate current (AC) component (e.g., as shown by the waveform 1112).

In one embodiment, the positive power supply voltage ramps up at the beginning of the time period $T_N$ (e.g., at the time $t_{27}$). For example, during the time period $T_N$, the positive power supply voltage increases from a low value (e.g., approximately zero at the time $t_{27}$) to a predetermined voltage 1116 (e.g., PVCC at the time $t_{29}$) as shown by the waveform 1102. In another example, the positive power supply voltage remains at the predetermined voltage 1116 during the rest of the powering up process (e.g., as shown by the waveform 1102). Hence, the transistors 924 and 926 can operate properly as switches according to certain embodiments.

According to another embodiment, during the time period $T_O$, the signal 960 (e.g., $V_{cramp}$) ramps up (e.g., from zero at the time $t_{28}$, as shown by the waveform 1104). For example, the switching frequency of the amplifier 972 remains at a maximum frequency 1134 (e.g., as shown by the waveform 1108). In another example, the output signal 956 (e.g., $V_{out}$) remains at a predetermined value 1128 that is larger than zero (e.g., as shown by the waveform 1110) during the time period $T_O$. In another example, the signal 996 (e.g., VCM_out) generated by sampling and holding the output signal 956 (e.g., $V_{out}$) is at the predetermined value 1128. In yet another example, the signal 960 (e.g., $V_{cramp}$) is no larger in magnitude than the signal 996 (e.g., VCM_out) during the time period $T_O$. In yet another example, the switch 986 is closed in response to the control signal 999 generated from the comparison of the signal 960 and the signal 996, and the signal 996 (e.g., VCM_out) is input to the operational amplifier 916. In yet another example, the voltage across the capacitor 968 remains at a predetermined value 1130 during the time period $T_O$ (e.g., $V_{c0}$>0) as shown by the waveform 1112.

According to yet another embodiment, during the time period $T_P$, the signal 960 (e.g., $V_{cramp}$) continues to increase (e.g., as shown by the waveform 1104). For example, the switching frequency of the amplifier 972 remains at a maximum frequency 1134 (e.g., as shown by the waveform 1108). In another example, the signal 960 (e.g., $V_{cramp}$) is larger in magnitude than the signal 996 (e.g., VCM_out), but lower in magnitude than a threshold voltage 1132 (e.g., as shown by the waveform 1104). In yet another example, the switch 988 is closed in response to the control signal 999 generated from the comparison of the signal 960 and the signal 996, and the signal 960 (e.g., $V_{cramp}$) is input to the amplifier 916. In yet another example, the output signal 942 generated by the loop filter 938 is compared with the ramping signal 944 (e.g., $V_{ramp}$) at the comparator 920, and the modulation signal 950 is generated in response. In another example, the modulation signal 950 has narrow pulse widths. Hence, the signal 956 (e.g., $V_{out}$) has narrow pulse widths, and the pulse widths of the signal 956 increase over time (e.g., as shown by the waveform 1110) according to certain embodiments. In another example, the DC component of the voltage across the capacitor 968 ramps up from the predetermined value 1130 (e.g. at the time $t_{30}$) as shown by the waveform 1112.

According to yet another embodiment, at the beginning of the time period $T_Q$, the signal 960 (e.g., $V_{cramp}$) is lower in magnitude than a threshold value 1132 (e.g., as shown by the waveform 1104). For example, referring to FIG. 10, the signal 1030 is equal in magnitude to the signal 960 (e.g., $V_{cramp}$) subtracted by the signal 996 (e.g., VCM_out). In another example, the signal 1030 is no larger than the reference signal 1020 (e.g., $V_{refl}$) in magnitude. In yet another example, the current generator 982 generates the current signal 980 that is proportional to the current 1018 in magnitude. In yet another example, the switching frequency of the amplifier 972 is at the maximum frequency 1134 (e.g., as shown by the waveform 1108).

According to yet another embodiment, during the time period $T_Q$, the signal 960 (e.g., $V_{cramp}$) continues to ramp up (e.g., until reaching the threshold value 1132 at the time $t_{32}$, as shown by the waveform 1104). For example, the switching frequency of the amplifier 972 decreases (e.g., from the maximum frequency 1134 at the time $t_{31}$ to a minimum frequency 1136 at the time $t_{32}$) as shown by the waveform 1108. In another example, the pulse width of the output signal 956 (e.g., $V_{out}$) continues to increase over time (e.g., as shown by the waveform 1110). In another example, the DC component of the voltage across the capacitor 968 continues to ramp up (e.g., as shown by the waveform 1112). In yet another example, the maximum frequency 1134 is several times (e.g., twice or thrice) as much as the minimum frequency 1136.

According to another embodiment, during the time period $T_R$, the signal 960 (e.g., $V_{cramp}$) continues to increase until reaching a predetermined value 1138 (e.g., as shown by the waveform 1104). For example, the switching frequency of the amplifier 972 remains at the minimum frequency 1136 (e.g., as shown by the waveform 1108). In another example, the pulse width of the output signal 956 (e.g., $V_{out}$) continues to increase over time (e.g., as shown by the waveform 1110). In another example, the DC component of the voltage across the capacitor 968 continues to increase (e.g., as shown by the waveform 1112).

According to yet another embodiment, during the time periods $T_O$, $T_P$, $T_Q$, and $T_R$, the resistance of the variable resistor 914 (e.g., RV) is infinity (e.g., as shown by the waveform 1106). Hence, the gain of the amplifier 972 is zero (e.g., the mute mode of the amplifier 972) according to certain embodiments.

According to yet another embodiment, during the time period $T_S$, the signal 960 remains at the predetermined value 1138 (e.g., as shown by the waveform 1104). For example, the switching frequency of the amplifier 972 remains at the minimum frequency 1136 (e.g., as shown by the waveform 1108). In another example, the DC component of the voltage across the capacitor 968 (e.g., $V_Q$) reaches a predetermined value 1140 (e.g., PVCC/2 at the time $t_{35}$ as shown by the waveform 1112). In yet another example, the resistance of the variable resistor 914 (e.g., RV) decreases from infinity (e.g., at the time $t_{34}$) to a low value (e.g., approximately zero at the time $t_{35}$) as shown by the waveform 1106. Hence, the amplifier 972 begins to amplify the input audio signal 958 (e.g., after the time $t_{34}$) according to certain embodiments.

Figure 11B:
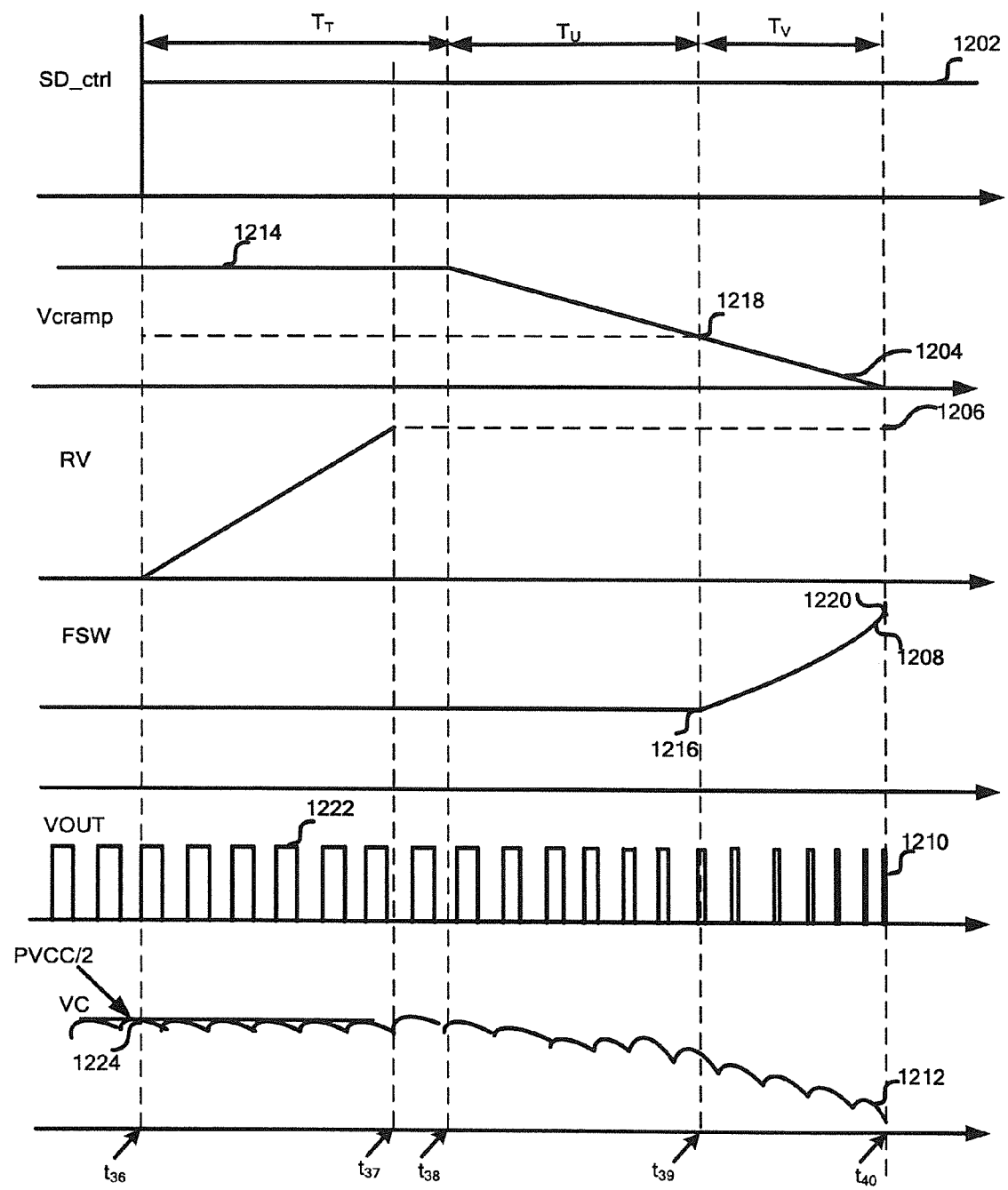

FIG. 11(b) is a simplified timing diagram for the amplification system 900 during the process of powering down or shutting down the amplification system 900 according to an embodiment of the present invention. This diagram is merely an example, which should not unduly limit the scope of the claims. One of ordinary skill in the art would recognize many variations, alternatives, and modifications.

The waveform 1202 represents the shut down control signal 976 as a function of time, the waveform 1204 represents the signal 960 (e.g., $V_{cramp}$) as a function of time, and the waveform 1206 represents the resistance of the variable resistor 914 (e.g., RV) as a function of time. Additionally, the waveform 1208 represents the switching frequency of the amplifier 972 (e.g., $F_{SW}$) as a function of time, the waveform 1210 represents the output signal 956 (e.g., $V_{out}$) as a function of time, and the waveform 1212 represents the voltage across the capacitor 968 (e.g., $V_C$) as a function of time.

Three time periods $T_T$, $T_U$, and $T_V$ are shown in FIG. 11(b). The time period $T_T$ starts at time $t_{36}$ and ends at time $t_{38}$, the time period $T_U$ starts at time $t_{38}$ and ends at time $t_{39}$, and the time period $T_V$ starts at time $t_{39}$ and ends at time $t_{40}$. For example, the time $t_{37}$ is within the time period $T_T$. In another example, $t_{36} \leq t_{37} \leq t_{38} \leq t_{39} \leq t_{40}$.

In one embodiment, at the beginning of the time period $T_T$ (e.g., at the time $t_{36}$), the shut down control signal 976 changes from a logic low level to a logic high level (e.g., as shown by the waveform 1202). For example, the shut down control signal 976 remains at the logic high level during the rest of the powering down process (e.g., as shown by the waveform 1202).

According to another embodiment, during the time period $T_T$, the signal 960 (e.g., $V_{cramp}$) remains at a predetermined value 1214 (e.g., as shown by the waveform 1204). For example, the switching frequency of the amplifier 972 (e.g., $F_{sw}$) remains at a minimum frequency 1216 (e.g., as shown by the waveform 1208). In another example, the pulse width (e.g., the pulse width 1222) and the pulse density of the output signal 956 (e.g., $V_{out}$) do not change much during the time period $T_T$ (e.g., as shown by the waveform 1210). In yet another example, the DC component of the voltage across the capacitor 968 (e.g., $V_C$) remains at approximately a predetermined value 1224 (e.g., as shown by the waveform 1212). In yet another example, the resistance of the variable resistor 914 (e.g., RV) increases from a low value (e.g., approximately zero at the time $t_{36}$) to infinity (e.g., at the time $t_{37}$), and remains at infinity for the rest of the powering down process (e.g., as shown by the waveform 1206). Hence, the gain of the amplifier 972 reduces to zero (e.g., entering the mute mode) at the time $t_{37}$, and keeps at zero for the rest of the powering down process according to certain embodiments.

According to yet another embodiment, during the time period $T_U$, the signal 960 (e.g., $V_{cramp}$) reduces from the predetermined value 1214 (e.g., at the time $t_{38}$) to a threshold value 1218 (e.g., at the time $t_{39}$) as shown by the waveform 1204. For example, the switching frequency (e.g., $F_{sw}$) remains at the minimum frequency 1216 (e.g., as shown by the waveform 1208). In another example, the pulse width of the output signal 956 (e.g., $V_{out}$) decreases (e.g., as shown by the waveform 1210) during the time period $T_U$. In yet another example, the DC component of the voltage across the capacitor 968 (e.g., $V_C$) decreases (e.g., from the predetermined value 1224) as shown by the waveform 1212. In yet another example, the predetermined value 1214 is equal to the predetermined value 1138.

According to yet another embodiment, during the time period $T_V$, the signal 960 (e.g., $V_{cramp}$) continues to decrease from the threshold value 1218 (e.g., at the time $t_{39}$) to a low value (e.g., approximately zero at the time $t_{40}$) as shown by the waveform 1204. For example, the switching frequency (e.g., $F_{SW}$) of the amplifier 972 increases from the minimum frequency 1216 (e.g., at the time $t_{39}$) to a maximum frequency 1220 (e.g., at the time $t_{40}$) as shown by the waveform 1208. In another example, the pulse width of the output signal 956 (e.g., $V_{out}$) continues to decrease during the time period $T_V$ (e.g., as shown by the waveform 1210). In yet another example, the DC component of the voltage across the capacitor 968 (e.g., $V_C$) decreases to a low value (e.g., approximately zero at the time $t_{40}$) as shown by the waveform 1212.

As the switching frequency of the amplifier 972 is no less than the minimum frequency 1216 during the time period $T_V$, the pulse density of the output signal 956 is not low (e.g., as shown by the waveform 1210) even though the cycle skipping still exists, according to certain embodiments. For example, the transistors 924 and 926 are switched on or off at a frequency beyond the audio frequency range, and hence the undesired audible transients are reduced. In another example, the maximum frequency 1220 is several times (e.g., twice or thrice) as much as the minimum frequency 1216. In yet another example, the maximum frequency 1220 is equal to the maximum frequency 1134, and the minimum frequency 1216 is equal to the minimum frequency 1136.

According to another embodiment, a system for amplifying an input signal to generate an output signal includes a current generator, an oscillator, and a comparator. The current generator is configured to receive a first voltage signal, process information associated with the first voltage signal and a first reference signal, and generate a first current signal based on at least information associated with the first voltage signal and the first reference signal. The oscillator is configured to receive at least the first current signal and a second reference signal, and to generate a second voltage signal based on at least information associated with the first current signal and the second reference signal, the second voltage signal being associated with a modulation frequency. The comparator is configured to receive the second voltage signal and a third voltage signal, and to generate a modulation signal related to the modulation frequency based on at least information associated with the second voltage signal and the third voltage signal, the third voltage signal being related to at least the input signal, the first voltage signal, and a feedback signal, the feedback signal being associated with the output signal. Additionally, the first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude. In another example, the system is implemented according to at least FIG. 5, FIG. 6, FIG. 7(a) and FIG. 7(b).

According to another embodiment, a system for amplifying an input signal to generate an output signal includes a signal detection component, a signal selection component, a current generator, an oscillator, and a first comparator. The signal detection component is configured to receive the output signal and to generate a first reference signal. The signal selection component is configured to receive the first reference signal and a first voltage signal, and to generate a selected signal based on information associated with the first reference signal and the first voltage signal. The current generator is configured to receive the first reference signal and the first voltage signal, process information associated with the first reference signal, the first voltage signal and a second reference signal, and generate a first current signal based on at least information associated with the first reference signal, the first voltage signal and the second reference signal. The oscillator is configured to receive at least the first current signal and a third reference signal, and to generate a second voltage signal based on at least information associated with the first current signal and the third reference signal, the second voltage signal being associated with a modulation frequency. The first comparator configured to receive the second voltage signal and a third voltage signal, and to generate a modulation signal related to the modulation frequency based on at least information associated with the second voltage signal and the third voltage signal, the third voltage signal being related to at least the input signal, the selected signal, and a feedback signal, the feedback signal being associated with the output signal. Further, the first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude. In another example, the system is implemented according to at least FIG. 9, FIG. 10, FIG. 11(a) and FIG. 11(b).

According to yet another embodiment, a method for amplifying an input signal to generate an output signal includes receiving a first voltage signal, processing information associated with the first voltage signal and a first reference signal, and generating a first current signal based on at least information associated with the first voltage signal and the first reference signal. Additionally, the method includes receiving at least the first current signal and a second reference signal, processing information associated with the first current signal and the second reference signal, and generating a second voltage signal based on at least information associated with the first current signal and the second reference signal, the second voltage signal being associated with a modulation frequency. Furthermore, the method includes receiving the second voltage signal and a third voltage signal, processing information associated with the second voltage signal and the third voltage signal, and generating a modulation signal related to the modulation frequency based on at least information associated with the second voltage signal and the third voltage signal, the third voltage signal being related to at least the input signal, the first voltage signal, and a feedback signal, the feedback signal being associated with the output signal. Moreover, the first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude. In another example, the method is implemented according to at least FIG. 5, FIG. 6, FIG. 7(a) and FIG. 7(b).

According to yet another embodiment, a method for amplifying an input signal to generate an output signal includes receiving the output signal, processing information associated with the output signal, and generating a first reference signal. The method further includes receiving the first reference signal and a first voltage signal, processing information associated with the first reference signal and the first voltage signal, and generating a selected signal based on information associated with the first reference signal and the first voltage signal. Additionally, the method includes receiving the first reference signal and the first voltage signal, processing information associated with the first reference signal, the first voltage signal and a second reference signal, and generating a first current signal based on at least information associated with the first reference signal, the first voltage signal and the second reference signal. Furthermore, the method includes receiving at least the first current signal and a third reference signal, processing information associated with the first current signal and the third reference signal, and generating a second voltage signal based on at least information associated with the first current signal and the third reference signal, the second voltage signal being associated with a modulation frequency. Moreover, the method includes receiving the second voltage signal and a third voltage signal, processing information associated with the second voltage signal and the third voltage signal, and generating a modulation signal related to the modulation frequency based on at least information associated with the second voltage signal and the third voltage signal, the third voltage signal being related to at least the input signal, the selected signal, and a feedback signal, the feedback signal being associated with the output signal. The first current signal decreases if the first voltage signal increases in magnitude. The modulation frequency decreases if the first current signal decreases in magnitude. For example, the first current signal increases in magnitude if the first voltage signal decreases in magnitude, and the modulation frequency increases in magnitude if the first current signal increases in magnitude. In another example, the method is implemented according to at least FIG. 9, FIG. 10, FIG. 11(a) and FIG. 11(b).

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for amplifying an input signal to generate an output signal, the system comprising:
    a current generator configured to receive a first voltage signal, process information associated with the first voltage signal and a first reference signal, and generate a first current signal based on at least information associated with the first voltage signal and the first reference signal;
    an oscillator configured to receive at least the first current signal and a second reference signal, and to generate a second voltage signal based on at least information associated with the first current signal and the second reference signal, the second voltage signal being associated with a modulation frequency; and
    a comparator configured to receive the second voltage signal and a third voltage signal, and to generate a modulation signal related to the modulation frequency based on at least information associated with the second voltage signal and the third voltage signal, the third voltage signal being related to at least the input signal, the first voltage signal and a feedback signal, the feedback signal being associated with the output signal;
    wherein:
        the first current signal decreases if the first voltage signal increases in magnitude; and
        the modulation frequency decreases if the first current signal decreases in magnitude.

2. The system of claim 1 wherein the current generator includes:
    a current source configured to output an input current;
    a comparison circuit including a first circuit branch and a second circuit branch, the first circuit branch and the second circuit branch being coupled to the current source; and
    a current mirror circuit including a third circuit branch and a fourth circuit branch, the third circuit branch and the fourth circuit branch being coupled with each other;
    wherein:
        the first circuit branch includes a first transistor, the first transistor including a first gate terminal, the first gate terminal being configured to receive the first voltage signal;
        the first circuit branch is configured to receive a first branch current, the first branch current being at least a part of the input current;
        the second circuit branch includes a second transistor, the second transistor including a second gate terminal, the second gate terminal being configured to receive the first reference signal; and
        the second circuit branch is configured to receive a second branch current, the second branch current being at least a part of the input current, the input current being equal in magnitude to the sum of the first branch current and the second branch current;
    wherein:
        the current mirror circuit is coupled to the first circuit branch and configured to generate a first mirror current in the third circuit branch, the first mirror current being equal in magnitude to the first branch current multiplied by a first predetermined ratio; and
        the current mirror circuit is further configured to output the first current signal in the fourth circuit branch, the first current signal being equal in magnitude to the first mirror current multiplied by a second predetermined ratio.

3. The system of claim 2 wherein:
    the first current signal is no larger in magnitude than the input current multiplied by the first predetermined ratio and the second predetermined ratio; and
    the first current signal is no less than zero in magnitude.

4. The system of claim 3 wherein:
    the first current signal increases in magnitude as a ratio of the first reference signal to the first voltage signal increases in magnitude; and
    the first current signal approaches zero in magnitude as the ratio of the first reference signal to the first voltage signal approaches zero in magnitude.

5. The system of claim 1 and further comprising a gate driver configured to receive the modulation signal and to generate a first drive signal and a second drive signal based on at least information associated with the modulation signal.

6. The system of claim 5 and further comprising:
a first switch configured to receive the first drive signal; and
a second switch configured to receive the second drive signal, the first switch and the second switch being coupled at a first node;
wherein the first switch and the second switch are further configured to generate the output signal at the first node.

7. The system of claim 5 wherein the first drive signal is the same as the second drive signal.

8. The system of claim 1 wherein the modulation frequency is proportional to the sum of the first current signal and the second reference signal in magnitude.

9. The system of claim 1 wherein the current generator is further configured to:
compare the first voltage signal and the first reference signal;
if the first voltage signal subtracted by the first reference signal increases, decrease the first current signal; and
if the first voltage signal subtracted by the first reference signal decreases, increase the first current signal.

10. The system of claim 1 wherein the first current signal increases in magnitude if the first voltage signal decreases in magnitude, and the modulation frequency increases in magnitude if the first current signal increases in magnitude.

11. The system of claim 1 wherein the modulation signal includes a pulse-width modulation signal.

12. The system of claim 1 wherein the second voltage signal is associated with a triangle waveform.

13. The system of claim 1 wherein the current generator is further configured to receive the first voltage signal, the first voltage signal increasing to a first predetermined value and remaining at the first predetermined value in response to powering up of the system, the first voltage signal decreasing from a second predetermined value in response to powering down of the system.

14. The system of claim 13 wherein the first predetermined value and the second predetermined value are the same.

15. A system for amplifying an input signal to generate an output signal, the system comprising:
a signal detection component configured to receive the output signal and generate a first reference signal;
a signal selection component configured to receive the first reference signal and a first voltage signal, and to generate a selected signal based on information associated with the first reference signal and the first voltage signal;
a current generator configured to receive the first reference signal and the first voltage signal, process information associated with the first reference signal, the first voltage signal and a second reference signal, and generate a first current signal based on at least information associated with the first reference signal, the first voltage signal and the second reference signal;
an oscillator configured to receive at least the first current signal and a third reference signal, and to generate a second voltage signal based on at least information associated with the first current signal and the third reference signal, the second voltage signal being associated with a modulation frequency; and
a first comparator configured to receive the second voltage signal and a third voltage signal, and to generate a modulation signal related to the modulation frequency based on at least information associated with the second voltage signal and the third voltage signal, the third voltage signal being related to at least the input signal, the selected signal and a feedback signal, the feedback signal being associated with the output signal;
wherein:
the first current signal decreases if the first voltage signal subtracted by the first reference signal increases; and
the modulation frequency decreases if the first current signal decreases in magnitude.

16. The system of claim 15 wherein the current generator includes:
a current source configured to output an input current;
a comparison circuit including a first circuit branch, and a second circuit branch, the first circuit branch and the second circuit branch being coupled to the current source;
a current mirror circuit including a third circuit branch and a fourth circuit branch, the third circuit branch and the fourth circuit branch being coupled with each other; and
an arithmetic component configured to receive the first voltage signal and the first reference signal, and to generate a comparison signal;
wherein:
the first circuit branch includes a first transistor, the first transistor including a first gate terminal, the first gate terminal being configured to receive the comparison signal;
the second circuit branch includes a second transistor, the second transistor including a second gate terminal, the second gate terminal being configured to receive the second reference signal;
the first circuit branch is configured to receive a first branch current, the first branch current being at least a part of the input current;
the second circuit branch is configured to receive a second branch current, the second branch current being at least a part of the input current, the input current being equal in magnitude to the sum of the first branch current and the second branch current;
the current mirror circuit is coupled to the first circuit branch and configured to generate a first mirror current in the third circuit branch, the first mirror current being equal in magnitude to the first branch current multiplied by a first predetermined ratio; and
the current mirror circuit is further configured to output the first current signal in the fourth circuit branch, the first current signal being equal in magnitude to the first mirror current multiplied by a second predetermined ratio.

17. The system of claim 16 wherein:
the first current signal is no larger in magnitude than the input current multiplied by the first predetermined ratio and the second predetermined ratio; and
the first current signal is no less than zero in magnitude.

18. The system of claim 17 wherein:
the first current signal increases in magnitude as a ratio of the second reference signal to the comparison signal increases in magnitude; and
the first current signal approaches zero in magnitude as the ratio of the second reference signal to the comparison signal approaches zero in magnitude.

19. The system of claim 16 wherein the comparison signal is equal in magnitude to the first voltage signal subtracted by the first reference signal.

20. The system of claim 15 and further comprising:
a gate driver configured to receive the modulation signal, and to generate a first drive signal and a second drive signal based on at least information associated with the modulation signal.

21. The system of claim 20 and further comprising:
a first switch configured to receive the first drive signal; and
a second switch configured to receive the second drive signal, the first switch and the second switch being coupled at a first node;
wherein the first switch and the second switch are further configured to generate the output signal at the first node.

22. The system of claim 20 wherein the first drive signal is the same as the second drive signal.

23. The system of claim 15 wherein the modulation frequency is proportional in magnitude to the sum of the first current signal and the third reference signal in magnitude.

24. The system of claim 15 wherein the current generator is further configured to:
compare the comparison signal and the second reference signal;
if the comparison signal subtracted by the second reference signal increases, decrease the first current signal; and
if the comparison signal subtracted by the second reference signal decreases, increase the first current signal.

25. The system of claim 15 wherein the first current signal increases in magnitude if the first voltage signal decreases in magnitude, and the modulation frequency increases in magnitude if the first current signal increases in magnitude.

26. The system of claim 15 wherein the current generator is further configured to receive the first voltage signal, the first voltage signal increasing to a first predetermined value and remaining at the first predetermined value in response to powering up of the system, the first voltage signal decreasing from a second predetermined value in response to powering down of the system.

27. The system of claim 26 wherein the first predetermined value and the second predetermined value are the same.

28. The system of claim 15 wherein the selected signal is the same as the first reference signal if the first reference signal is larger than the first voltage signal in magnitude.

29. The system of claim 15 wherein the selected signal is the same as the first voltage signal if the first reference signal is no larger than the first voltage signal in magnitude.

30. The system of claim 15 wherein the signal detection component is further configured to receive a control signal to generate the first reference signal if the control signal indicates powering up of the system.

31. The system of claim 30 wherein:
the signal detection component includes a direct current (DC) detector and a sample and hold component;
the DC detector is configured to receive the output signal and generate a detected signal, the detected signal being representative of a DC component of the output signal; and
the sample and hold component is configured to receive the control signal and the detected signal and generate the first reference signal in response to at least the control signal.

32. The system of claim 31 wherein the sample and hold component samples the detected signal if the control signal indicates the powering up of the system.

33. The system of claim 32 wherein the first reference signal has a constant magnitude until at least the sample and hold component samples the detected signal again.

34. A method for amplifying an input signal to generate an output signal, the method comprising:
receiving a first voltage signal;
processing information associated with the first voltage signal and a first reference signal;
generating a first current signal based on at least information associated with the first voltage signal and the first reference signal;
receiving at least the first current signal and a second reference signal;
processing information associated with the first current signal and the second reference signal;
generating a second voltage signal based on at least information associated with the first current signal and the second reference signal, the second voltage signal being associated with a modulation frequency;
receiving the second voltage signal and a third voltage signal;
processing information associated with the second voltage signal and the third voltage signal; and
generating a modulation signal related to the modulation frequency based on at least information associated with the second voltage signal and the third voltage signal, the third voltage signal being related to at least the input signal, the first voltage signal, and a feedback signal, the feedback signal being associated with the output signal;
wherein:
the first current signal decreases if the first voltage signal increases in magnitude; and
the modulation frequency decreases if the first current signal decreases in magnitude.

35. A method for amplifying an input signal to generate an output signal, the method comprising:
receiving the output signal;
processing information associated with the output signal;
generating a first reference signal;
receiving the first reference signal and a first voltage signal;
processing information associated with the first reference signal and the first voltage signal;
generating a selected signal based on information associated with the first reference signal and the first voltage signal;
receiving the first reference signal and the first voltage signal;
processing information associated with the first reference signal, the first voltage signal and a second reference signal;
generating a first current signal based on at least information associated with the first reference signal, the first voltage signal and the second reference signal;
receiving at least the first current signal and a third reference signal;
processing information associated with the first current signal and the third reference signal;
generating a second voltage signal based on at least information associated with the first current signal and the third reference signal, the second voltage signal being associated with a modulation frequency;
receiving the second voltage signal and a third voltage signal;
processing information associated with the second voltage signal and the third voltage signal; and
generating a modulation signal related to the modulation frequency based on at least information associated with the second voltage signal and the third voltage signal, the third voltage signal being related to at least the input signal, the selected signal, and a feedback signal, the feedback signal being associated with the output signal;
wherein:
the first current signal decreases if the first voltage signal increases in magnitude; and the modulation frequency decreases if the first current signal decreases in magnitude.

* * * * *